United States Patent
Kim et al.

(10) Patent No.: US 12,538,499 B2
(45) Date of Patent: Jan. 27, 2026

(54) SEMICONDUCTOR DEVICE INCLUDING DIELECTRIC LAYER AND METHOD OF FORMING THE SAME

(71) Applicant: SAMSUNG ELECTRONICS CO., LTD., Suwon-si (KR)

(72) Inventors: Eunsun Kim, Suwon-si (KR); Boeun Park, Hwaseong-si (KR); Cheolhyun An, Seongnam-si (KR); Hyungjun Kim, Suwon-si (KR); Younggeun Park, Suwon-si (KR); Jeongil Bang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 432 days.

(21) Appl. No.: 18/147,289

(22) Filed: Dec. 28, 2022

(65) Prior Publication Data

US 2023/0253447 A1  Aug. 10, 2023

(30) Foreign Application Priority Data

Feb. 9, 2022  (KR) .................. 10-2022-0016809

(51) Int. Cl.
*H10D 1/00* (2025.01)
*H10D 1/68* (2025.01)

(52) U.S. Cl.
CPC ............. *H10D 1/042* (2025.01); *H10D 1/684* (2025.01); *H10D 1/696* (2025.01); *H10D 1/712* (2025.01); *H10D 1/714* (2025.01)

(58) Field of Classification Search
CPC ........ H10D 1/712; H10D 1/042; H10D 1/684; H10D 1/696; H10D 1/682; H10D 52/57
See application file for complete search history.

(56) References Cited

U.S. PATENT DOCUMENTS

| | | |
|---|---|---|
| 6,924,521 B2 | 8/2005 | Arisumi et al. |
| 2004/0135183 A1 | 7/2004 | Matsuura et al. |
| 2005/0167699 A1 | 8/2005 | Sugita et al. |

(Continued)

FOREIGN PATENT DOCUMENTS

| | | | |
|---|---|---|---|
| EP | 1587146 A2 | | 10/2005 |
| JP | 2010171456 A | * | 8/2010 |

(Continued)

OTHER PUBLICATIONS

JP-2010171456—English Machine Translation (Year: 2025).*

(Continued)

*Primary Examiner* — Jose R Diaz

(74) *Attorney, Agent, or Firm* — Morgan, Lewis & Bockius LLP

(57) ABSTRACT

A method of forming a semiconductor device includes forming a first electrode on a single-crystal structure. A dielectric layer is formed on the first electrode. A second electrode is formed on the dielectric layer. The forming a dielectric layer includes forming a first dielectric layer having a single-crystal perovskite structure on the first electrode, and forming a second dielectric layer on the first dielectric layer. An upper surface of the first dielectric layer adjacent to the second dielectric layer has a greater surface roughness than an upper surface of the second dielectric layer adjacent to the second electrode.

19 Claims, 20 Drawing Sheets

(56) References Cited

U.S. PATENT DOCUMENTS

| | | |
|---|---|---|
| 2009/0072349 A1 | 3/2009 | Tak et al. |
| 2009/0152607 A1 | 6/2009 | Tanaka et al. |
| 2010/0196592 A1 | 8/2010 | Kim et al. |
| 2012/0108028 A1 | 5/2012 | Sills et al. |
| 2019/0214455 A1 | 7/2019 | Kang et al. |
| 2019/0311980 A1 | 10/2019 | Eid et al. |
| 2021/0202508 A1 | 7/2021 | Jeon |
| 2021/0241974 A1* | 8/2021 | Yamazaki ............ H01G 4/1218 |

FOREIGN PATENT DOCUMENTS

| | | |
|---|---|---|
| KR | 10-2001-0109274 A | 12/2001 |
| KR | 10-2011-0047839 A | 5/2011 |
| KR | 10-1096227 | 12/2011 |
| KR | 10-2014-0003189 | 1/2014 |
| TW | 201234533 A | 8/2012 |
| WO | WO-0039842 A1 * 7/2000 | ............ H10D 1/692 |
| WO | 2005041303 A1 | 5/2005 |

OTHER PUBLICATIONS

WO-0039842—English Machine Translation (Year: 2025).*
Vac, "Dielectric breakdown in epitaxial BaTiO3 thin films", Journal of Vacuum Science & Technology B, 38, 044007 (2020), 7 pages.
Ngo, et al., "Epitaxial c-axis oriented BaTiO3 thin films on SrTiO3-buffered Si(001) by atomic layer deposition", Applied Physics Letters 104, 082910 (2014), pp. 082910-1-082910-4.
Vac, "Epitaxial strontium titanate films grown by atomic layer deposition on SrTiO3-buffered Si(001) substrates", Journal of Vacuum Science & Technology A 31, 01A136 (2013), 10 pages.
Granted Patent Publication in corresponding TW 112104197 dated Oct. 21, 2024, (In Chinese) 20 pages.
Office Action dated Dec. 19, 2025 issued in corresponding to Korean Patent Application No. 10-2022-0016809.

* cited by examiner

SEMICONDUCTOR DEVICE INCLUDING DIELECTRIC LAYER AND METHOD OF FORMING THE SAME

CROSS-REFERENCE TO THE RELATED APPLICATION

This application claims priority from Korean Patent Application No. 10-2022-0016809, filed on Feb. 9, 2022, in the Korean Intellectual Property Office, the disclosure of which is incorporated herein by reference in its entirety.

BACKGROUND

1 Field

The exemplary embodiments of the disclosure relate to a semiconductor device including a dielectric layer having a single-crystal perovskite structure and a method of forming the same.

2. Description of the Related Art

In accordance with high integration of a semiconductor device, various technologies for increasing the dielectric constant of a capacitor dielectric layer are being attempted. An increase in the dielectric constant of the capacitor dielectric layer greatly influences an increase in the capacitance of the capacitor and an enhancement in reliability of the capacitor. A low dielectric constant of the capacitor dielectric layer may interfere with light weight, thinness, simplification and miniaturization of the resultant semiconductor device.

SUMMARY

The exemplary embodiments of the disclosure provide semiconductor devices having excellent electrical characteristics and methods of forming the same.

A method of forming a semiconductor device in accordance with exemplary embodiments of the disclosure includes forming a first electrode on a single-crystal structure. A dielectric layer is formed on the first electrode. A second electrode is formed on the dielectric layer. The forming a dielectric layer includes forming a first dielectric layer having a single-crystal perovskite structure on the first electrode, and forming a second dielectric layer on the first dielectric layer. An upper surface of the first dielectric layer adjacent to the second dielectric layer has a greater surface roughness than an upper surface of the second dielectric layer adjacent to the second electrode.

A method of forming a semiconductor device in accordance with exemplary embodiments of the disclosure includes forming a switching device on a semiconductor substrate. A pad separation layer is formed on the switching device. A conductive pad connected to the switching device while extending through the pad separation layer is formed. A first electrode is formed on the conductive pad. A dielectric layer is formed on the first electrode. A second electrode is formed on the dielectric layer. The forming a dielectric layer includes forming a first dielectric layer having a single-crystal perovskite structure on the first electrode, and forming a second dielectric layer on the first dielectric layer. An upper surface of the first dielectric layer adjacent to the second dielectric layer has a greater surface roughness than an upper surface of the second dielectric layer adjacent to the second electrode.

A method of forming a semiconductor device in accordance with exemplary embodiments of the disclosure includes forming a first electrode having a single-crystal perovskite structure on a single-crystal perovskite strontium titanate ($SrTiO_3$) substrate using a pulsed laser deposition (PLD) method. A dielectric layer is formed on the first electrode. A second electrode is formed on the dielectric layer. The forming a dielectric layer includes forming a first dielectric layer having a single-crystal perovskite structure on the first electrode using an atomic layer deposition (ALD) method, and forming a second dielectric layer on the first dielectric layer. An upper surface of the first dielectric layer adjacent to the second dielectric layer has a greater surface roughness than an upper surface of the second dielectric layer adjacent to the second electrode. A thickness of the second dielectric layer is 0.05 to 0.3 times a thickness of the first dielectric layer. The dielectric layer has a dielectric constant of 100 to 900.

DETAILED DESCRIPTION OF EXEMPLARY EMBODIMENTS

Figure 10:
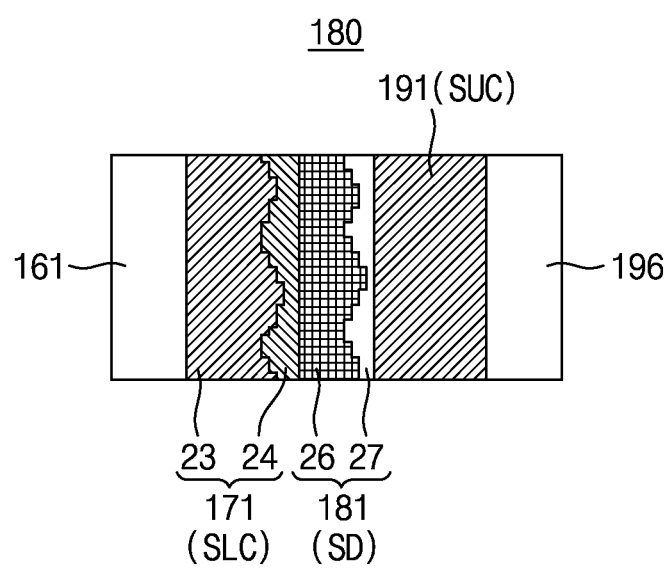
FIGS. 10 and 11 are partial views showing a portion of FIG. 9.
Figure 11:
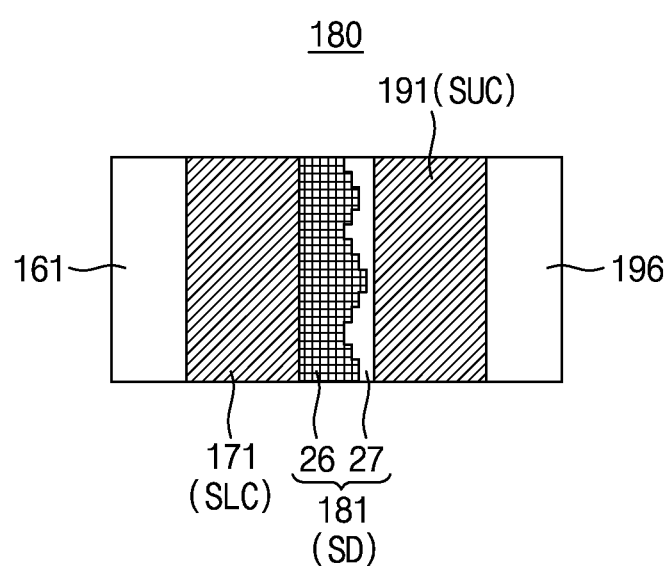
Figure 12:
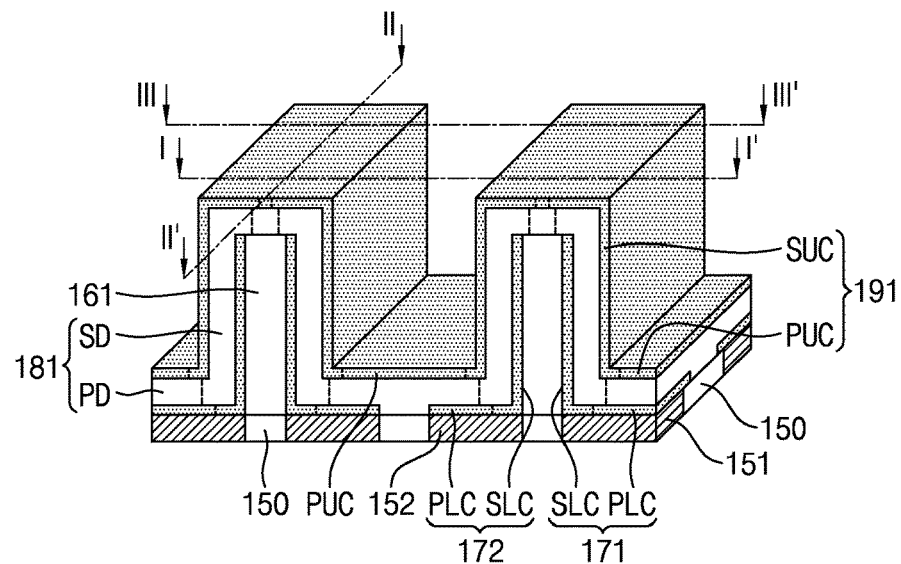
FIG. 12 is a perspective view explaining semiconductor devices according to exemplary embodiments of the disclosure.
Figure 13:
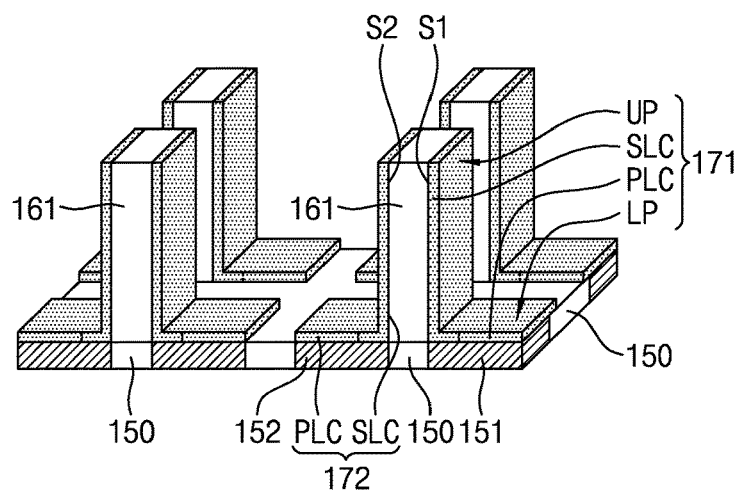
FIG. 13 is a partial view showing a portion of FIG. 12.
Figure 14:
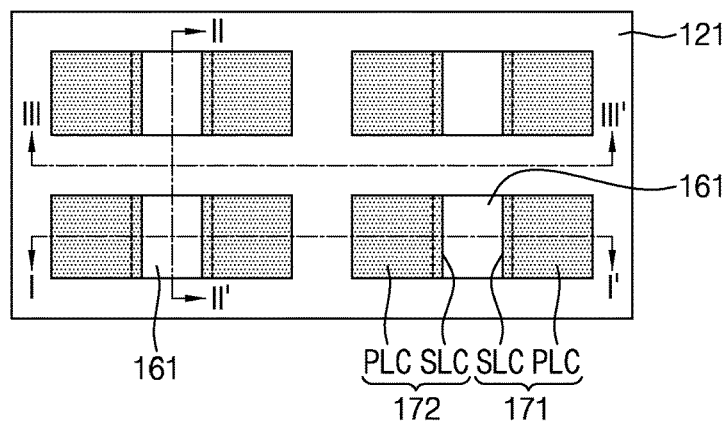
FIG. 14 is a layout explaining semiconductor devices according to exemplary embodiments of the disclosure.

FIGS. 1 to 5 and FIGS. 7 and 9 are cross-sectional views explaining semiconductor devices according to exemplary embodiments of the disclosure. FIG. 6 is a partial view showing a portion 80 of FIG. 5. FIG. 8 is a partial view of a portion 81 of FIG. 7. FIGS. 10 and 11 are partial views showing a portion 180 of FIG. 9. FIG. 12 is a perspective view explaining semiconductor devices according to exemplary embodiments of the disclosure. FIG. 13 is a partial view showing a portion of FIG. 12. FIG. 14 is a layout explaining semiconductor devices according to exemplary embodiments of the disclosure.

Figure 1:
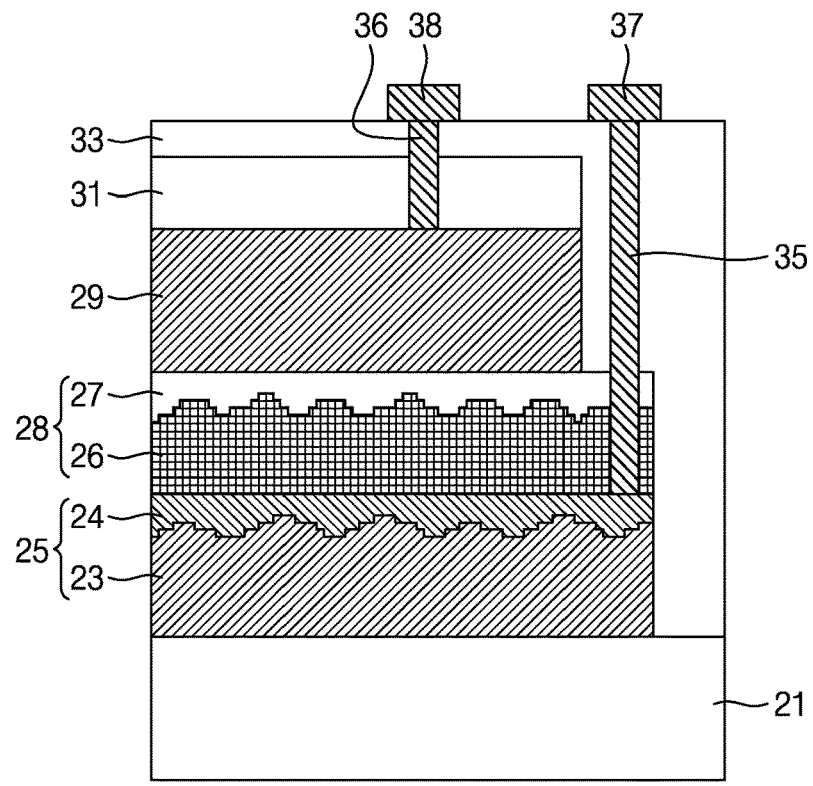
FIGS. 1 to 5 and FIGS. 7 and 9 are cross-sectional views explaining semiconductor devices according to exemplary embodiments of the disclosure.

Referring to FIG. 1, semiconductor devices according to exemplary embodiments of the disclosure may include a substrate 21, a first electrode 25, a dielectric layer 28, a second electrode 29, a first insulating layer 31, a second insulating layer 33, a first contact plug 35, a second contact plug 36, a first wiring 37, and a second wiring 38. The first electrode 25 may include a first conductive layer 23 and a second conductive layer 24. The first electrode 25 may correspond to a lower electrode of a capacitor. The dielectric layer 28 may include a first dielectric layer 26 and a second dielectric layer 27. The dielectric layer 28 may correspond to a capacitor dielectric layer. The second electrode 29 may correspond to an upper electrode of the capacitor. The first electrode 25, the dielectric layer 28 and the second electrode 29 may constitute the capacitor.

In an embodiment, an upper surface of the second conductive layer 24 adjacent to the dielectric layer 28 may have a smaller surface roughness than an upper surface of the first conductive layer 23 adjacent to the second conductive layer 24. An upper surface of the first dielectric layer 26 adjacent to the second dielectric layer 27 may have a greater surface roughness than an upper surface of the second dielectric layer 27 adjacent to the second electrode 29.

Figure 2:
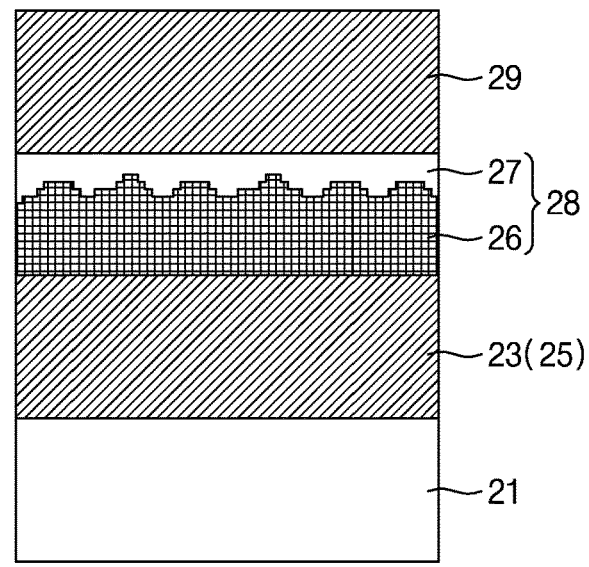

Referring to FIG. 2, semiconductor devices according to exemplary embodiments of the disclosure may include a substrate 21, a first electrode 25, a dielectric layer 28, and a second electrode 29. The first electrode 25 may include a first conductive layer 23. The first electrode 25 may correspond to a lower electrode of a capacitor. The dielectric layer 28 may include a first dielectric layer 26 and a second dielectric layer 27. The dielectric layer 28 may correspond to a capacitor dielectric layer. The second electrode 29 may correspond to an upper electrode of the capacitor. The first electrode 25, the dielectric layer 28, and the second electrode 29 may constitute the capacitor.

Figure 3:
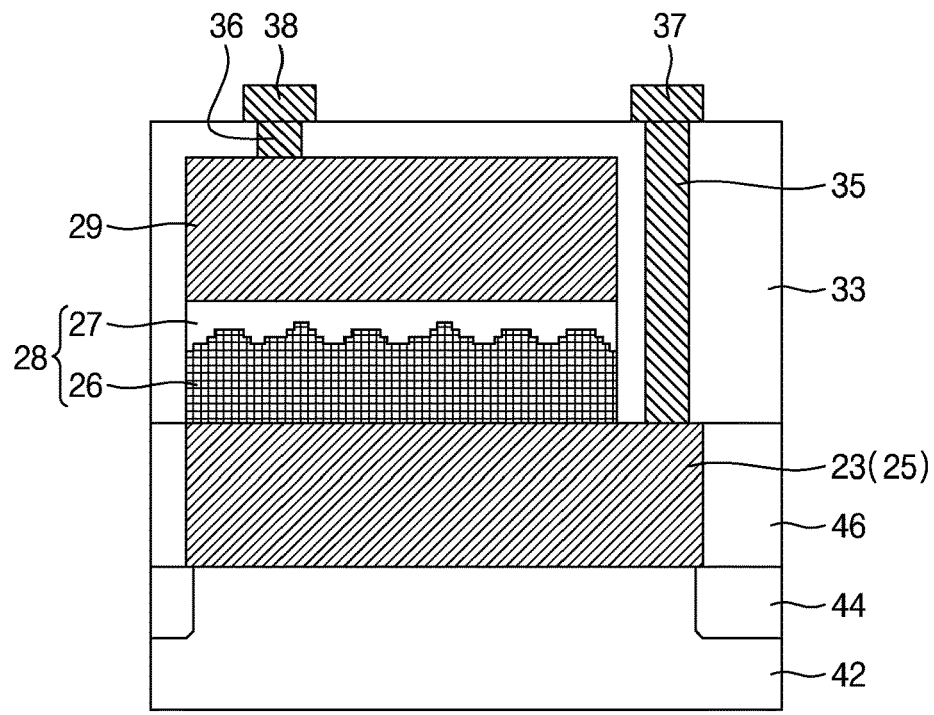

Referring to FIG. 3, semiconductor devices according to exemplary embodiments of the disclosure may include a substrate 42, a device isolation layer 44, a first insulating layer 46, a first electrode 25, a dielectric layer 28, a second electrode 29, a second insulating layer 33, a first contact plug 35, a second contact plug 36, a first wiring 37, and a second wiring 38. The first electrode 25 may include a first conductive layer 23. The dielectric layer 28 may include a first dielectric layer 26 and a second dielectric layer 27. The first electrode 25, the dielectric layer 28, and the second electrode 29 may constitute a capacitor.

Figure 4:
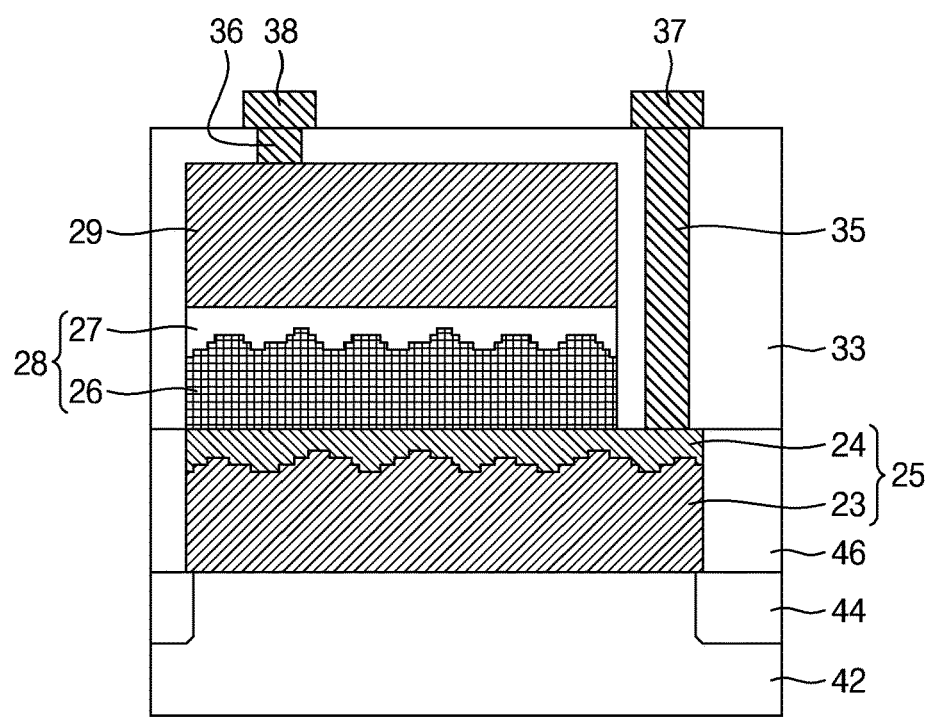

Referring to FIG. 4, semiconductor devices according to exemplary embodiments of the disclosure may include a substrate 42, a device isolation layer 44, a first insulating layer 46, a first electrode 25, a dielectric layer 28, a second electrode 29, a second insulating layer 33, a first contact plug 35, a second contact plug 36, a first wiring 37, and a second wiring 38. The first electrode 25 may include a first conductive layer 23 and a second conductive layer 24. The dielectric layer 28 may include a first dielectric layer 26 and a second dielectric layer 27. The first electrode 25, the dielectric layer 28, and the second electrode 29 may constitute a capacitor.

Figure 5:
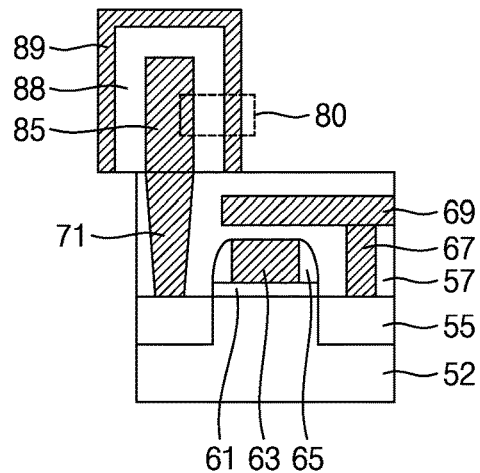
Figure 6:
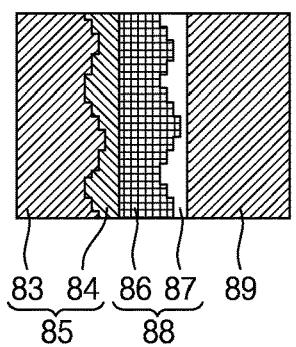
FIG. 6 is a partial view showing a portion of FIG. 5.

Referring to FIGS. 5 and 6, semiconductor devices according to exemplary embodiments of the disclosure may include a semiconductor substrate 52, a plurality of source/drain regions 55, a lower insulating layer 57, a gate dielectric layer 61, a gate electrode 63, a gate spacer 65, a bit plug 67, a bit line 69, a buried contact plug 71, a first electrode 85, a dielectric layer 88, and a second electrode 89. The first electrode 85 may include a first conductive layer 83 and a second conductive layer 84. The second conductive layer 84 may be omitted. The dielectric layer 88 may include a first dielectric layer 86 and a second dielectric layer 87.

The semiconductor substrate 52, the plurality of source/drain regions 55, the gate dielectric layer 61, and the gate electrode 63 may constitute a transistor. In an embodiment, the transistor may include a planar transistor, a fin field effect transistor (FinFET), a multi-bridge channel transistor such as MBCFET®, a nanowire transistor, a vertical transistor, a recess channel transistor, a 3-D transistor, or a combination thereof. In an embodiment, the semiconductor substrate 52, the plurality of source/drain regions 55, the gate dielectric layer 61, and the gate electrode 63 may correspond to a switching device such as a transistor.

The first electrode 85, the dielectric layer 88, and the second electrode 89 may constitute a capacitor. The capacitor may be connected to the transistor. For example, the first electrode 85 may be connected to a selected one of the plurality of source/drain regions 55 via the buried contact plug 71. The capacitor and the transistor may constitute a memory cell of a dynamic random access memory (DRAM).

The semiconductor substrate 52 may include a single-crystal semiconductor substrate such as a single-crystal silicon wafer. Each of the plurality of source/drain regions 55 may include a single-crystal semiconductor pattern having N-type or P-type impurities. Each of the lower insulating layer 57, the gate dielectric layer 61, and the gate spacer 65 may include at least two selected from the group consisting of Si, O, N, C, H, and B. Each of the lower insulating layer 57, the gate dielectric layer 61, and the gate spacer 65 may include silicon oxide, silicon nitride, silicon oxynitride, low-k dielectrics, high-k dielectrics, or a combination thereof.

Each of the gate electrode 63, the bit plug 67, the bit line 69, and the buried contact plug 71 may include a single layer or multiple layers. Each of the gate electrode 63, the bit plug 67, the bit line 69, and the buried contact plug 71 may include a conductive material such as a metal, metal nitride, metal oxide, metal silicide, conductive carbon, polysilicon, amorphous silicon, single-crystal semiconductor (for example, single-crystal silicon), or a combination thereof.

The first electrode 85 may have a pillar shape, a cylindrical shape, a box shape, or a combination thereof. The first electrode 85 may contact the buried contact plug 71 in plan view. The dielectric layer 88 may be formed on the first electrode 85. The second electrode 89 may be formed on the dielectric layer 88. The second electrode 89 may cover the first electrode 85 in plan view. The dielectric layer 88 may be interposed between the first electrode 85 and the second electrode 89. Each of the first conductive layer 83, the second conductive layer 84, the first dielectric layer 86, the second dielectric layer 87, and the second electrode 89 may include a configuration similar to that of a corresponding one of the first conductive layer 23, the second conductive layer 24, the first dielectric layer 26, the second dielectric layer 27, and the second electrode 29 described with reference to FIGS. 1 to 4.

Figure 7:
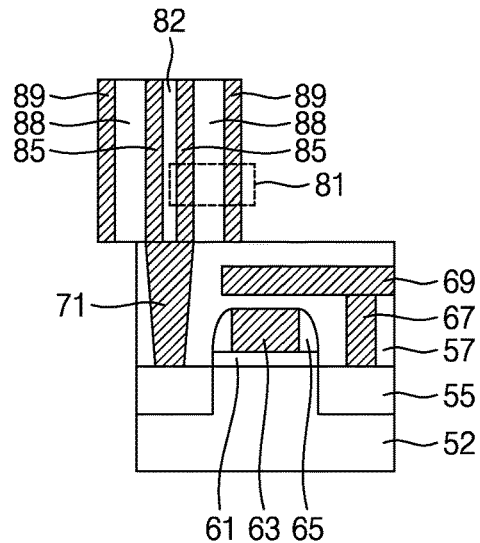
Figure 8:
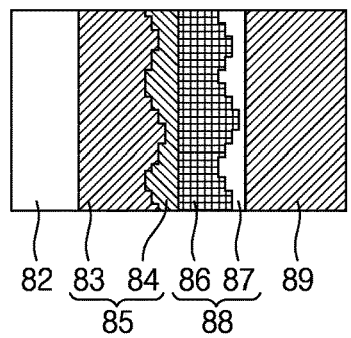
FIG. 8 is a partial view of a portion of FIG. 7.

Referring to FIGS. 7 and 8, semiconductor devices according to exemplary embodiments of the disclosure may include a semiconductor substrate 52, a plurality of source/drain regions 55, a lower insulating layer 57, a gate dielectric layer 61, a gate electrode 63, a gate spacer 65, a bit plug 67, a bit line 69, a buried contact plug 71, a single-crystal mold 82, a first electrode 85, a dielectric layer 88, and a second electrode 89. The first electrode 85 may include a first conductive layer 83 and a second conductive layer 84. The second conductive layer 84 may be omitted. The dielectric layer 88 may include a first dielectric layer 86 and a second dielectric layer 87.

In an embodiment, the semiconductor substrate 52, the plurality of source/drain regions 55, the gate dielectric layer 61, and the gate electrode 63 may correspond to a switching device such as a transistor. The first electrode 85, the dielectric layer 88, and the second electrode 89 may constitute a capacitor. The capacitor and the transistor may constitute a memory cell of a DRAM.

The single-crystal mold 82 may include a configuration similar to that of the substrate 21 or the substrate 42 described with reference to FIGS. 1 to 4. The first electrode 85 may be formed on a side surface of the single-crystal mold 82. The dielectric layer 88 may be formed on a side surface of the first electrode 85. The second electrode 89 may be formed on a side surface of the dielectric layer 88.

The dielectric layer 88 may be interposed between the first electrode 85 and the second electrode 89.

Figure 9:
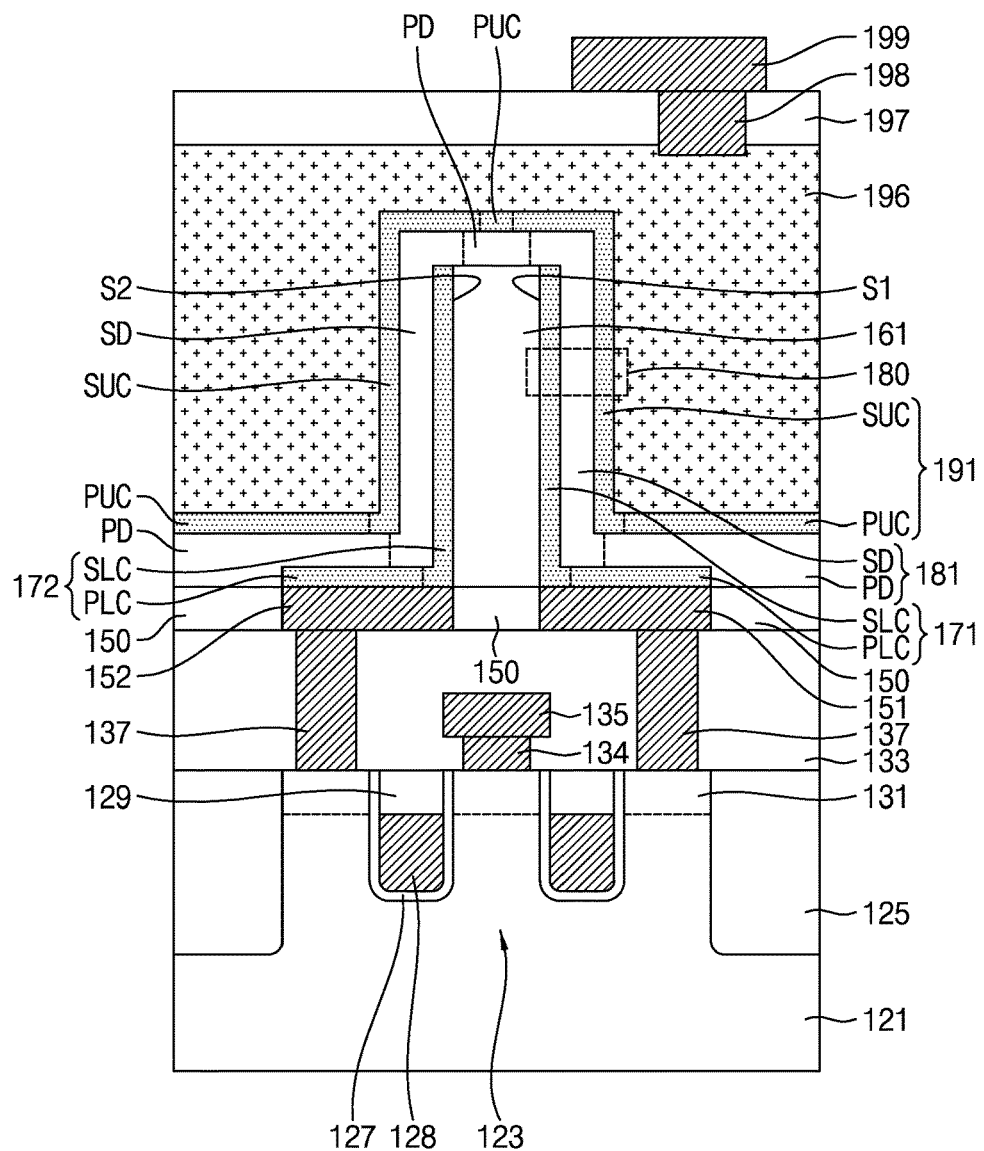

Referring to FIG. 9, semiconductor devices according to exemplary embodiments of the disclosure may include a semiconductor substrate 121, an active region 123, a device isolation layer 125, a gate dielectric layer 127, gate electrodes 128, a gate capping layer 129, source/drain regions 131, an interlayer insulating layer 133, a bit contact plug 134, a bit line 135, buried contact plugs 137, a pad separation layer 150, a plurality of conductive pads 151 and 152, an insulating pattern 161, a plurality of first electrodes 171 and 172, a dielectric layer 181, a second electrode 191, an additional electrode 196, an upper insulating layer 197, an upper contact plug 198, and an upper wiring 199.

The plurality of conductive pads 151 and 152 may include a first conductive pad 151 and a second conductive pad 152. The plurality of first electrodes 171 and 172 may include a right electrode 171 and a left electrode 172. The plurality of first electrodes 171 and 172 may each include a first crystalline conductive layer SLC and a second crystalline conductive layer PLC. The dielectric layer 181 may include a first dielectric region SD and a second dielectric region PD. The second electrode 191 may include a first region SUC and a second region PUC.

The semiconductor substrate 121 may include various kinds of materials such as a silicon wafer or a silicon-on-insulator (SOI) wafer. The device isolation layer 125, which defines the active region 123, may be formed on the semiconductor substrate 121.

The gate dielectric layer 127, the gate electrodes 128, and the gate capping layer 129 may be sequentially stacked in the active region 123. The source/drain regions 131 may be formed in the active region 123 adjacent to opposite sides of the gate electrodes 128. The gate dielectric layer 127 may be interposed between the active region 123 and the gate electrodes 128. The gate electrodes 128 may be formed at a lower level than an upper end of the active region 123. Each of the gate electrodes 128 may correspond to a word line. The gate capping layer 129 may cover the gate electrodes 128 in plan view. The source/drain regions 131 may include impurities having a conductivity type different from that of the active region 123. For example, the active region 123 may include P-type impurities, whereas the source/drain regions 131 may include N-type impurities.

The interlayer insulating layer 133 may cover the active region 123, the device isolation layer 125, the gate dielectric layer 127, the gate electrodes 128, the gate capping layer 129, and the source/drain regions 131. The bit contact plug 134 and the bit line 135 may be formed in the interlayer insulating layer 133. The bit line 135 may be connected to a selected one of the source/drain regions 131 via the bit contact plug 134. The buried contact plugs 137 may be formed in the interlayer insulating layer 133. Each of the buried contact plugs 137 may be connected to a selected one of the source/drain regions 131 while extending through the interlayer insulating layer 133.

The pad separation layer 150 and the plurality of conductive pads 151 and 152 may be formed on the interlayer insulating layer 133. Each of the plurality of conductive pads 151 and 152 may contact a selected one of the buried contact plugs 137 while extending through the pad separation layer 150. The pad isolation layer 150 may be disposed among the plurality of conductive pads 151 and 152.

Each of the device isolation layer 125, the gate dielectric layer 127, the gate capping layer 129, the interlayer insulating layer 133, and the pad separation layer 150 may include a single layer or multiple layers. Each of the device isolation layer 125, the gate dielectric layer 127, the gate capping layer 129, the interlayer insulating layer 133, and the pad separation layer 150 may include at least two selected from the group consisting of Si, O, N, C, H, and B. Each of the device isolation layer 125, the gate dielectric layer 127, the gate capping layer 129, the interlayer insulating layer 133, and the pad separation layer 150 may include silicon oxide, silicon nitride, silicon oxynitride, low-k dielectrics, high-k dielectrics, or a combination thereof.

Each of the gate electrodes 128, the bit contact plug 134, the bit line 135, the buried contact plugs 137, and the plurality of conductive pads 151 and 152 may include a single layer or multiple layers. Each of the gate electrodes 128, the bit contact plug 134, the bit line 135, the buried contact plugs 137, and the plurality of conductive pads 151 and 152 may include a conductive material such as a metal, metal nitride, metal oxide, metal silicide, polysilicon, conductive carbon, single-crystal semiconductor, polycrystalline semiconductor, or a combination thereof.

The active region 123, the gate dielectric layer 127, the gate electrodes 128, and the source/drain regions 131 may constitute a plurality of transistors. In an embodiment, the plurality of transistors may each function as a switching device. In an embodiment, the switching device may be constituted by other active/passive devices such as a diode. The plurality of conductive pads 151 and 152 may be connected to the source/drain regions 131 via the buried contact plugs 137. Each of the plurality of conductive pads 151 and 152 may be interpreted as being connected to the switching device via a selected one of the buried contact plugs 137. The first electrodes 171 and 172, the dielectric layer 181, and the second electrode 191 may constitute capacitors.

Each of the plurality of conductive pads 151 and 152 may be surrounded by the pad separation layer 150. The insulating pattern 161 may be formed on the pad separation layer 150 between the first conductive pad 151 and the second conductive pad 152. The insulating pattern 161 may have a greater height than a horizontal width thereof. The insulating pattern 161 may include a first side surface S1, and a second side surface S2 facing the first side surface S1. The first side surface S1 may be adjacent to the first conductive pad 151, whereas the second side surface S2 may be adjacent to the second conductive pad 152.

The plurality of first electrodes 171 and 172 may be formed beside the first and second side surfaces S1 and S2 of the insulating pattern 161. The right electrode 171 may contact the first conductive pad 151 while being adjacent to the first side surface S1. The left electrode 172 may contact the second conductive pad 152 while being adjacent to the second side surface S2. The first crystalline conductive layer SLC may be formed to be nearer to the insulating pattern 161 than the second crystalline conductive layer PLC. The first crystalline conductive layer SLC may directly contact the insulating pattern 161 and the plurality of conductive pads 151 and 152. The second crystalline conductive layer PLC may directly contact the plurality of conductive pads 151 and 152.

The dielectric layer 181 may cover the plurality of first electrodes 171 and 172 and may cover an upper surface of the insulating patterns 161 and the pad separation layer 150. The first dielectric region SD may be formed to be nearer to the first and second side surfaces S1 and S2 of the insulating pattern 161 than the second dielectric region PD. The first dielectric region SD may be formed to be nearer to the first crystalline conductive layer SLC than the second dielectric region PD. The first dielectric region SD may directly contact the first crystalline conductive layer SLC. The second dielectric region PD may directly contact the second crystalline conductive layer PLC, an upper surface of the insulating pattern 161, and the pad separation layer 150.

The second electrode 191 may cover the dielectric layer 181. The first region SUC may be formed to be nearer to the first dielectric region SD than the second region PUC. The first region SUC may directly contact the first dielectric region SD. The second region PUC may directly contact the second dielectric region PD.

In an embodiment, the first conductive pad 151 and the second conductive pad 152 may be interpreted as a pair of conductive pads 151 and 152. The plurality of first electrodes 171 and 172 may each have an L shape. The right electrode 171 and the left electrode 172 may be disposed in a mirrored manner with respect to the insulating pattern 161 interposed therebetween. A lower surface of the insulating pattern 161 may contact the pad separation layer 150 in plan view. The right electrode 171 and the left electrode 172 may be interpreted as a pair of first electrodes 171 and 172. The right electrode 171 may contact the first conductive pad 151 in plan view, and the left electrode 172 may contact the second conductive pad 152 in plan view. The right electrode 171 may be connected to a corresponding one of the plurality of transistors via the first conductive pad 151 and a selected one of the buried contact plugs 137. The left electrode 172 may be connected to a corresponding one of the plurality of transistors via the second conductive pad 152 and a selected one of the buried contact plugs 37. Each of the capacitors may be connected to a corresponding one of the plurality of transistors and, as such, may constitute a unit cell. The unit cell may include a selected one of the right electrode 171 and the left electrode 172.

Referring to FIG. 10, the first crystalline conductive layer SLC of the right electrode 171 may include a configuration similar to those of the first conductive layer 23 and the second conductive layer 24 described with reference to FIG. 1. The dielectric region SD of the dielectric layer 181 may include a configuration similar to those of the first dielectric layer 26 and the second dielectric layer 27 described with reference to FIGS. 1 and 2. The first region SUC of the second electrode 191 may include a configuration similar to that of the second electrode 29 described with reference to FIGS. 1 and 2.

Referring to FIG. 11, the first crystalline conductive layer SLC of the right electrode 171 may include a configuration similar to that of the first conductive layer 23 described with reference to FIG. 2. The first dielectric region SD of the dielectric layer 181 may include a configuration similar to those of the first dielectric layer 26 and the second dielectric layer 27 described with reference to FIGS. 1 and 2. The first region SUC of the second electrode 191 may include a configuration similar to that of the second electrode 29 described with reference to FIGS. 1 and 2.

Referring to FIG. 12, the semiconductor device may include a pad separation layer 150, a plurality of conductive pads 151 and 152, insulating patterns 161, a plurality of first electrodes 171 and 172, a dielectric layer 181, and a second electrode 191.

Referring to FIG. 13, the semiconductor device may include a pad separation layer 150, a plurality of conductive pads 151 and 152, insulating patterns 161, and a plurality of first electrodes 171 and 172. Each of the plurality of first electrodes 171 and 172 may include a lower region LP having a greater horizontal width than a height thereof, and an upper region UP having a greater height than a horizontal width thereof. The upper region UP may include a first crystalline conductive layer SLC. The lower region LP may include a second crystalline conductive layer PLC and the first crystalline conductive layer SLC. Each of the insulating patterns 161 may include a first side surface S1, and a second side surface S2 facing the first side surface S1. The first side surface S1 may be adjacent to the first conductive pad 151, whereas the second side surface S2 may be adjacent to the second conductive pad 152. The plurality of first electrodes 171 and 172 may be formed beside the side surfaces S1 and S2 of the insulating patterns 161. The right electrode 171 may contact the first conductive pad 151 while being adjacent to the first side surface S1. The left electrode 172 may contact the second conductive pad 152 while being adjacent to the second side surface S2.

Referring to FIG. 14, insulating patterns 161 and a plurality of first electrodes 171 and 172 may be disposed on a semiconductor substrate 121. The insulating patterns 161 may be repeatedly arranged in a row direction and a column direction.

Again referring to FIGS. 13 and 14, the pair of first electrodes 171 and 172 may be aligned on the pair of conductive pads 151 and 152. In an embodiment, the pair of conductive pads 151 and 152 may be repeatedly arranged in a row direction and a column direction on the semiconductor substrate 121. The pair of first electrodes 171 and 172 may be repeatedly arranged in a row direction and a column direction on the semiconductor substrate 121 such that the repeated arrangement thereof corresponds to the repeated arrangement of the pair of conductive pads 151 and 152. The pair of conductive pads 151 and 152 in the repeated arrangement thereof may be separated from each other by the pad separation layer 150.

Figure 15:
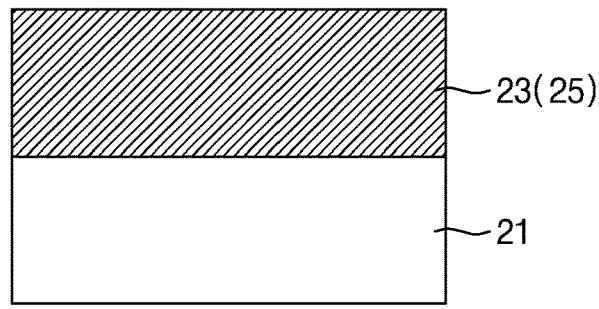
FIGS. 15 to 46 are cross-sectional views and perspective views explaining semiconductor device formation methods according to exemplary embodiments of the disclosure.
Figure 16:
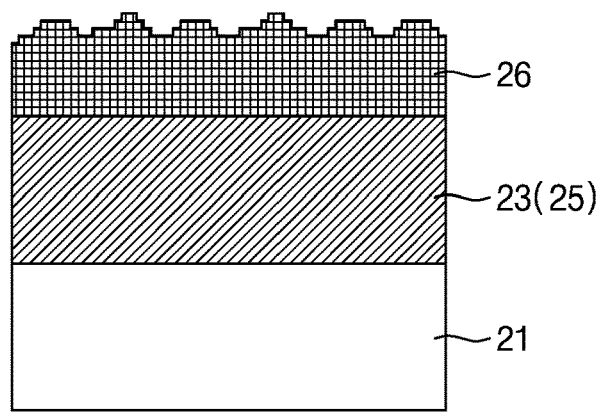
Figure 17:
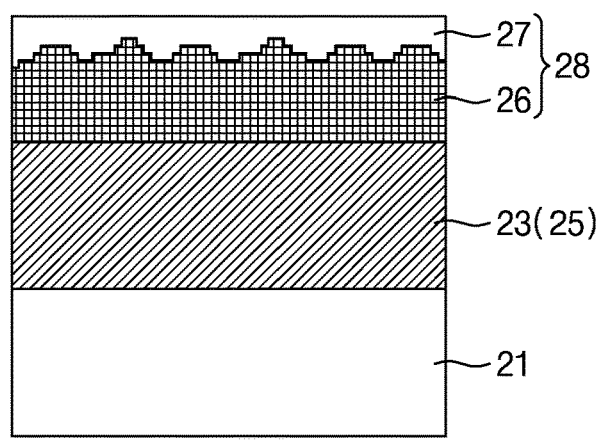

FIGS. 15 to 17 are cross-sectional views explaining semiconductor device formation methods according to exemplary embodiments of the disclosure.

Referring to FIG. 15, a first conductive layer 23 may be formed on a substrate 21. The first conductive layer 23 may constitute a first electrode 25. The first electrode 25 may correspond to a lower electrode of a capacitor.

The substrate 21 may include a material advantageous in forming a crystalline structure of the first conductive layer 23 The substrate 21 may include various kinds of single-crystal structures. In an embodiment, the substrate 21 may include strontium titanate ($SrTiO_3$). For example, the substrate 21 may include a strontium titanate substrate. The substrate 21 may include a perovskite structure. The substrate 21 may include a single-crystal perovskite strontium titanate substrate.

Forming the first conductive layer 23 may include a physical vapor deposition (PVD) method, an atomic layer deposition (ALD) method, or a combination thereof. The physical vapor deposition (PVD) method may include a pulsed laser deposition (PLD) method, a molecular beam epitaxy (MBE) method, or a combination thereof. In an embodiment, the first conductive layer 23 may be formed using a pulsed laser deposition (PLD) method or a molecular beam epitaxy (MBE) method. The first conductive layer 23 may include a perovskite structure. The first conductive layer 23 may include a single-crystal perovskite structure. The first conductive layer 23 may include a conductive material having a single-crystal perovskite structure, such as $SrRuO_3$, $SrIrO_3$, $SrSnO_3$, $SrMoO_3$, $CaRuO_3$, $LaNiO_3$, or a combination thereof. The first conductive layer 23 may have a thickness of 5 to 30 nm. For example, the first conductive layer 23 may include an $SrRuO_3$ layer having a single-crystal perovskite structure formed using a pulsed laser deposition (PLD) method. During formation of the first conductive layer 23, the substrate 21 may function as a crystallization seed. The first conductive layer 23 may correspond to an epitaxial electrode.

Referring to FIG. 16, a first dielectric layer 26 may be formed on the first conductive layer 23. Forming the first dielectric layer 26 may include an atomic layer deposition (ALD) method, a physical vapor deposition (PVD) method, or a combination thereof. For example, the atomic layer deposition (ALD) method may be applied to formation of the first dielectric layer 26. During formation of the first dielectric layer 26, the first conductive layer 23 may function as a crystallization seed.

The first dielectric layer 26 may include a perovskite structure. The first dielectric layer 26 may include a single-crystal perovskite structure. The first dielectric layer 26 may include a dielectric material having a single-crystal perovskite structure, such as $SrTiO_3$, $BaTiO_3$, $SrBaTiO_3$, $CaTiO_3$, $SrZrO_3$, $SrHfO_3$, $LaAlO_3$, or a combination thereof. The first dielectric layer 26 may have a thickness of 2 to 30 nm.

In an embodiment, the first dielectric layer 26 may include a rough surface. An upper surface of the first dielectric layer 26 may have a greater surface roughness than a lower surface of the first dielectric layer 26 adjacent to the first conductive layer 23.

Referring to FIG. 17, a second dielectric layer 27 may be formed on the first dielectric layer 26. The second dielectric layer 27 may correspond to a dielectric capping layer. Forming the second dielectric layer 27 may include an atomic layer deposition (ALD) method, a physical vapor deposition (PVD) method, or a combination thereof. For example, the atomic layer deposition (ALD) method may be applied to formation of the second dielectric layer 27. The second dielectric layer may have a smaller thickness than the first dielectric layer 26. The thickness of the second dielectric layer 27 may be 0.05 to 0.3 times the thickness of the first dielectric layer 26. The thickness of the second dielectric layer 27 may be 0.2 to 5 nm. The second dielectric layer 27 may include a material layer having a smaller surface roughness than the first dielectric layer 26. The second dielectric layer 27 may include a dielectric material such as SrO, BaO, $TiO_2$, $ZrO_2$, $HfO_2$, $Al_2O_3$, LaO, or a combination thereof.

In an embodiment, the second dielectric layer 27 may include a flat surface. An upper surface of the second dielectric layer 27 may have a smaller surface roughness than the upper surface of the first dielectric layer 26. The surface roughness of the upper surface of the first dielectric layer 26 adjacent to the second dielectric layer 27 may be greater than the surface roughness of the upper surface of the second dielectric layer 27.

The first dielectric layer 26 and the second dielectric layer 27 may constitute a dielectric layer 28. The dielectric constant of the dielectric layer 28 may be 100 to 900. In an embodiment, the dielectric layer 28 may correspond to a capacitor dielectric layer.

Again referring to FIG. 2, a second electrode 29 may be formed on the second dielectric layer 27. The second electrode 29 may correspond to an upper electrode of the capacitor. The second electrode 29 may have a thickness of 5 to 100 nm. The second electrode 29 may include a conductive material such as Ru, $RuO_2$, Ir, $IrO_2$, $SrRuO_3$, $SrIrO_3$, $SrSnO_3$, $SrMoO_3$, $CaRuO_3$, $LaNiO_3$, or a combination thereof. In an embodiment, the second electrode 29 may correspond to the upper electrode of the capacitor.

In an embodiment, the second electrode 29 may include a perovskite structure. The second electrode 29 may include a single-crystal perovskite structure. Forming the second electrode 29 may include an atomic layer deposition (ALD) method, a physical vapor deposition (PVD) method, or a combination thereof. The physical vapor deposition (PVD) method may include a pulsed laser deposition (PLD) method, a molecular beam epitaxy (MBE) method, or a combination thereof.

Figure 18:
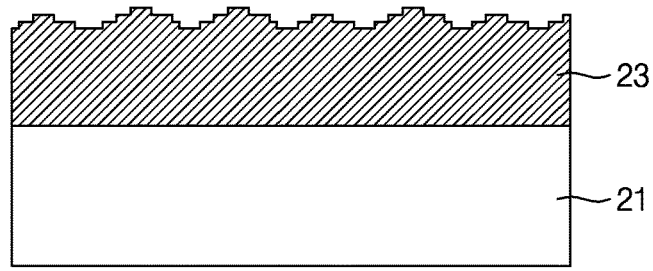
Figure 19:
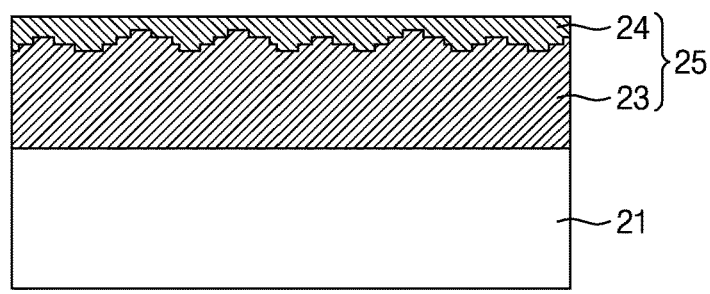
Figure 20:
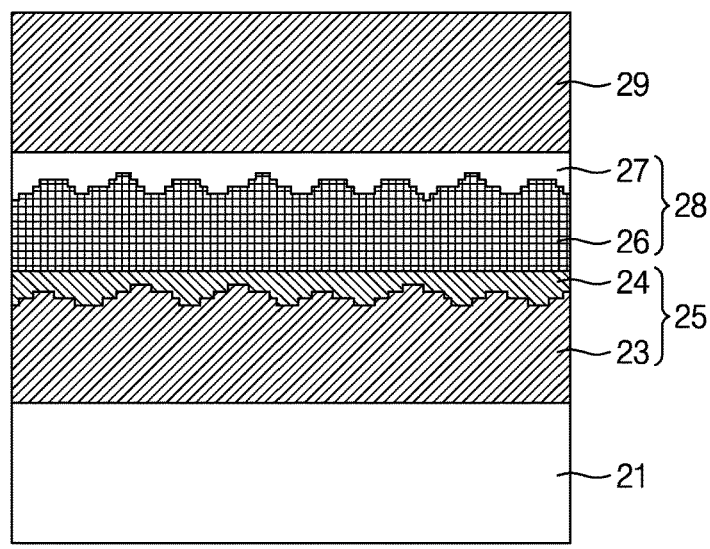

FIGS. 18 to 20 are cross-sectional views explaining semiconductor device formation methods according to exemplary embodiments of the disclosure.

Referring to FIG. 18, a first conductive layer 23 may be formed on a substrate 21. Forming the first conductive layer 23 on the substrate 21 may include a method similar to the method described with reference to FIG. 15. In an embodiment, the first conductive layer 23 may include a rough surface. An upper surface of the first conductive layer 23 may have a greater surface roughness than a lower surface of the first conductive layer 23 adjacent to the substrate 21.

Referring to FIG. 19, a second conductive layer 24 may be formed on the first conductive layer 23. The second conductive layer 24 may correspond to a conductive capping layer. The first conductive layer 23 and the second conductive layer 24 may constitute a first electrode 25. Forming the second conductive layer 24 may include a physical vapor deposition (PVD) method, an atomic layer deposition (ALD) method, or a combination thereof. The physical vapor deposition (PVD) method may include a pulsed laser deposition (PLD) method, a molecular beam epitaxy (MBE) method, or a combination thereof. The second conductive layer 24 may include a material layer having a smaller surface roughness than the first conductive layer 23. The second conductive layer 24 may include a conductive material such as Sr, Ru, Ir, Sn, Mo, Ca, La, Ni, SrO, RuO, IrO, SnO, MoO, CaO, LaO, NiO, $SrRuO_3$, $SrIrO_3$, $SrSnO_3$, $SrMoO_3$, $CaRuO_3$, $LaNiO_3$, or a combination thereof. In an embodiment, the second conductive layer 24 may include a perovskite structure.

The second conductive layer 24 may have a smaller thickness than the first conductive layer 23. The second conductive layer 24 may have a thickness of 0.2 to 5 nm. In an embodiment, the second conductive layer 24 may include a flat surface. An upper surface of the second conductive layer 24 may have a smaller surface roughness than an upper surface of the first conductive layer 23.

Referring to FIG. 20, a first dielectric layer 26, a second dielectric layer 27, and a second electrode 29 may be sequentially formed on the second conductive layer 24. Forming the first dielectric layer 26, the second dielectric layer 27, and the second electrode 29 may include methods similar to the methods described with reference to FIGS. 2, 16, and 17. The first dielectric layer 26 and the second dielectric layer 27 may constitute a dielectric layer 28.

Again referring to FIG. 1, a first insulating layer 31 may be formed on the second electrode 29. The first insulating layer 31, the second electrode 29, the dielectric layer 28, and the first electrode 25 may be partially removed, thereby partially exposing an upper surface of the substrate 21 and an upper surface of the dielectric layer 28. A second insulating layer 33 may be formed on the substrate 21, to cover the first insulating layer 31, the second electrode 29, the dielectric layer 28 and the first electrode 25. A first contact plug 35 may be formed to contact the first electrode 25 while extending through the second insulating layer 33 and the dielectric layer 28, and a second contact plug 36 may be formed to contact the second electrode 29 while extending through the second insulating layer 33 and the first insulating layer 31. A first wiring 37 contacting the first contact plug 35 and a second wiring 38 contacting the second contact plug 36 may be formed on the second insulating layer 33.

Each of the first insulating layer 31 and the second insulating layer 33 may include a single layer or multiple layers. Each of the first insulating layer 31 and the second insulating layer 33 may include at least two selected from the group consisting of Si, O, N, C, H, and B. Each of the first insulating layer 31 and the second insulating layer 33 may include silicon oxide, silicon nitride, silicon oxynitride, low-k dielectrics, high-k dielectrics, or a combination thereof.

Each of the first contact plug 35, the second contact plug 36, the first wiring 37, and the second wiring 38 may include a single layer or multiple layers. Each of the first contact plug 35, the second contact plug 36, the first wiring 37, and the second wiring 38 may include a metal, metal nitride, metal oxide, metal silicide, polysilicon, conductive carbon, or a combination thereof.

Figure 21:
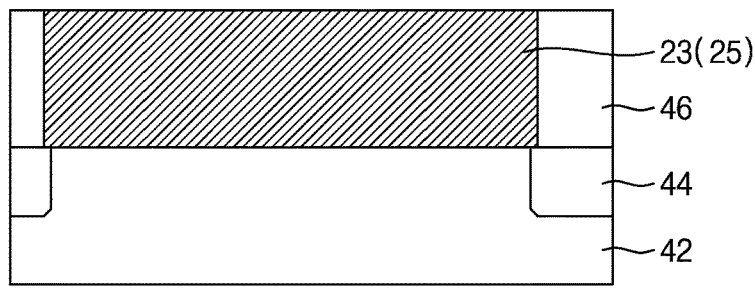
Figure 22:
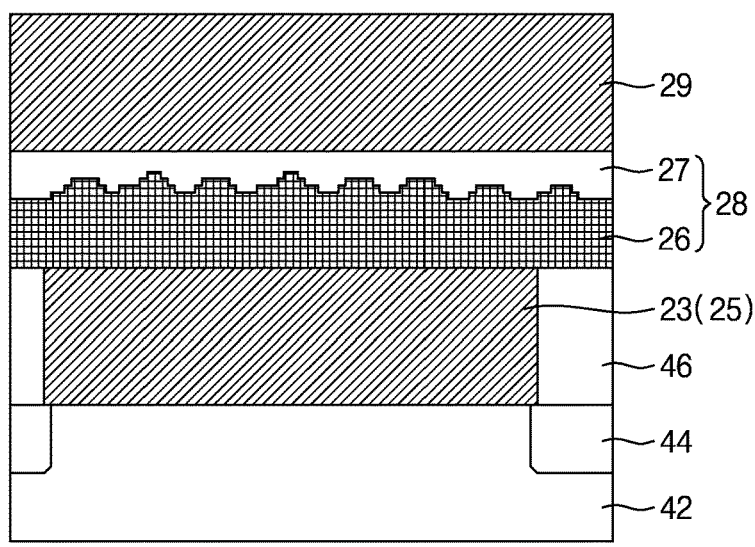
Figure 23:
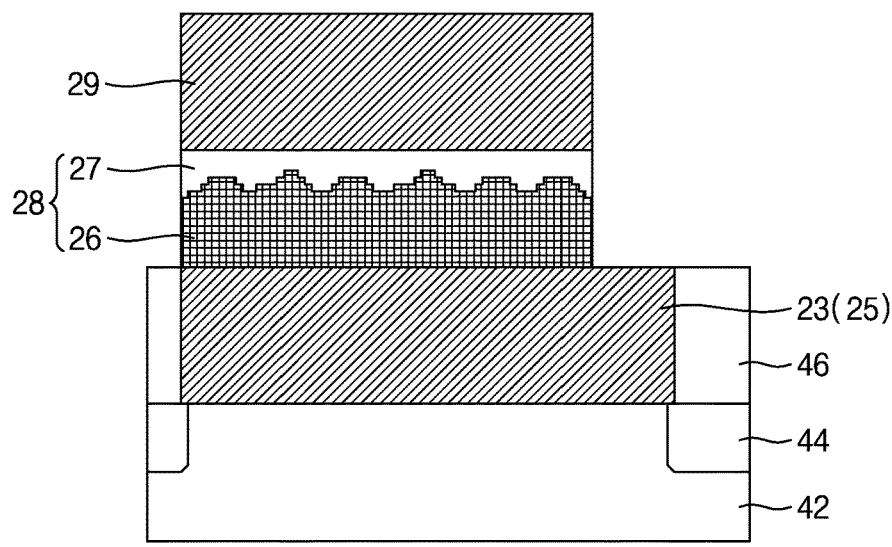

FIGS. 21 to 23 are cross-sectional views explaining semiconductor device formation methods according to exemplary embodiments of the disclosure.

Referring to FIG. 21, a device isolation layer 44 may be formed on a substrate 42. The substrate 42 may include a configuration similar to the configuration described with reference to FIG. 15. The device isolation layer 44 may be formed using a shallow trench isolation (STI) method. A first conductive layer 23 and a first insulating layer 46 may be formed on the substrate 42 and the device isolation layer 44. Forming the first conductive layer 23 may include a method similar to the method described with reference to FIG. 15. The first conductive layer 23 may directly contact the substrate 42 in plan view. The first insulating layer 46 may contact the device isolation layer 44 in plan view. The first insulating layer 46 may contact a side surface of the first conductive layer 23. Upper surfaces of the first conductive layer 23 and the first insulating layer 46 may be substantially coplanar. The first conductive layer 23 may constitute a first electrode 25.

Each of the device isolation layer 44 and the first insulating layer 46 may include a single layer or multiple layers. Each of the device isolation layer 44 and the first insulating layer 46 may include at least two selected from the group consisting of Si, O, N, C, H, and B. The device isolation layer 44 may include silicon oxide, silicon nitride, silicon oxynitride, low-k dielectrics, high-k dielectrics, or a combination thereof.

Referring to FIG. 22, a first dielectric layer 26, a second dielectric layer 27, and a second electrode 29 may be sequentially formed on the first conductive layer 23 and the first insulating layer 46. Forming the first dielectric layer 26, the second dielectric layer 27, and the second electrode 29 may include methods similar to the methods described with reference to FIGS. 2, 16, and 17. The first dielectric layer 26 and the second dielectric layer 27 may constitute a dielectric layer 28.

Referring to FIG. 23, the second electrode 29 and the dielectric layer 28 may be partially removed using a patterning process. The upper surfaces of the first conductive layer 23 and the first insulating layer 46 may be partially exposed.

Again referring to FIG. 3, a second insulating layer 33 may be formed on the first conductive layer 23, the first insulating layer 46, the dielectric layer 28, and the second electrode 29. A first contact plug 35 may be formed to contact the first conductive layer 23 while extending through the second insulating layer 33, and a second contact plug 36 may be formed to contact the second electrode 29 while extending through the second insulating layer 33. A first wiring 37 contacting the first contact plug 35 and a second wiring 38 contacting the second contact plug 36 may be formed on the second insulating layer 33.

Figure 24:
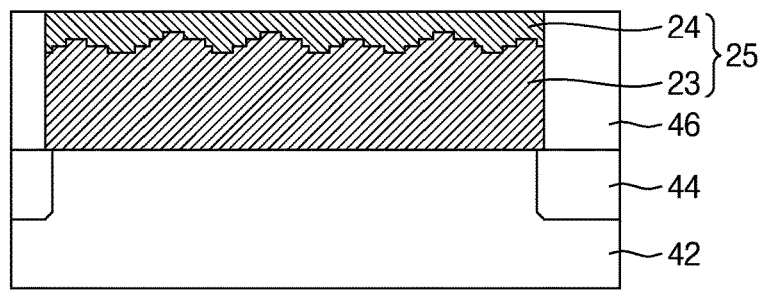
Figure 25:
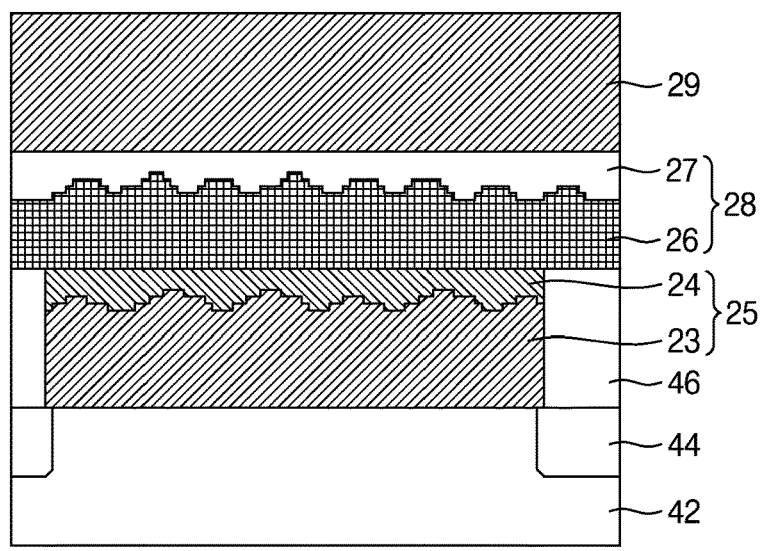
Figure 26:
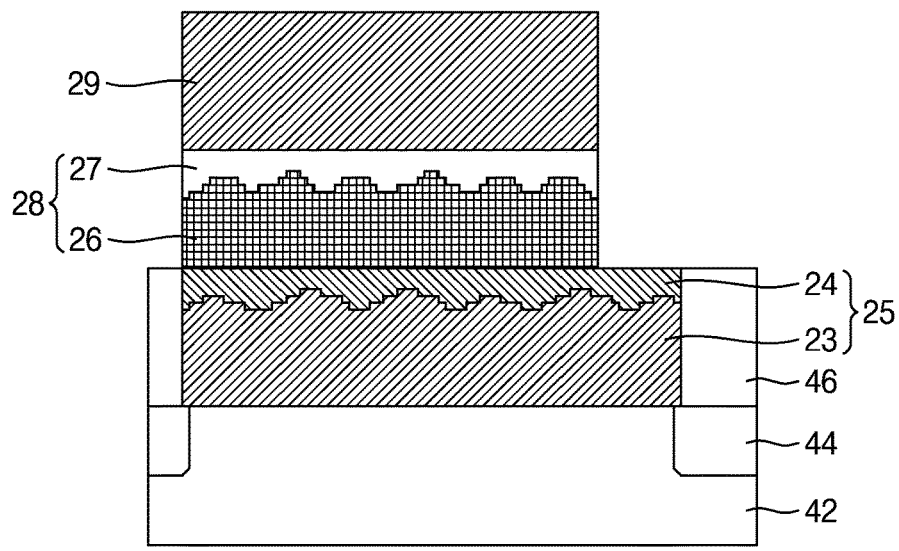

FIGS. 24 to 26 are cross-sectional views explaining semiconductor device formation methods according to exemplary embodiment of the disclosure.

Referring to FIG. 24, a device isolation layer 44 may be formed on a substrate 42. Forming the device isolation layer 44 on the substrate 42 may include a method similar to the method described with reference to FIG. 21. A first electrode 25 and a first insulating layer 46 may be formed on the substrate 42 and the device isolation layer 44. The first electrode 25 may include a first conductive layer 23 and a second conductive layer 24. Forming the first electrode 25 may include a method similar to the method described with reference to FIGS. 18 and 19. Forming the first insulating layer 46 may include a method similar to the method described with reference to FIG. 21.

Referring to FIG. 25, a first dielectric layer 26, a second dielectric layer 27, and a second electrode 29 may be sequentially formed on the first electrode 25 and the first insulating layer 46. Forming the first dielectric layer 26, the second dielectric layer 27, and the second electrode 29 may include methods similar to the methods described with reference to FIGS. 2, 16 and 17. The first dielectric layer 26 and the second dielectric layer 27 may constitute a dielectric layer 28.

Referring to FIG. 26, the second electrode 29 and the dielectric layer 28 may be partially removed using a patterning process. Upper surfaces of the second conductive layer 24 and the first insulating layer 46 may be partially exposed.

Again referring to FIG. 4, a second insulating layer 33 may be formed on the second conductive layer 24, the first insulating layer 46, the dielectric layer 28, and the second electrode 29. A first contact plug 35 may be formed to contact the second conductive layer 24 while extending through the second insulating layer 33, and a second contact plug 36 may be formed to contact the second electrode 29 while extending through the second insulating layer 33. A first wiring 37 contacting the first contact plug 35 and a second wiring 38 contacting the second contact plug 36 may be formed on the second insulating layer 33.

FIGS. 27, 29, 31, 33, 35, 37, 39, 41, 43, and 45 are perspective views explaining semiconductor device formation methods according to exemplary embodiments of the disclosure. FIGS. 28, 30, 32, 34, 36, 38, 40, 42, 44, and 46 are cross-sectional views. FIGS. 28, 30, 32, 34, 36, 38, 40, 42, 44, and 46 are cross-sectional views taken along lines I-I', II-II', and III-III' in FIGS. 12 and 14.

Figure 27:
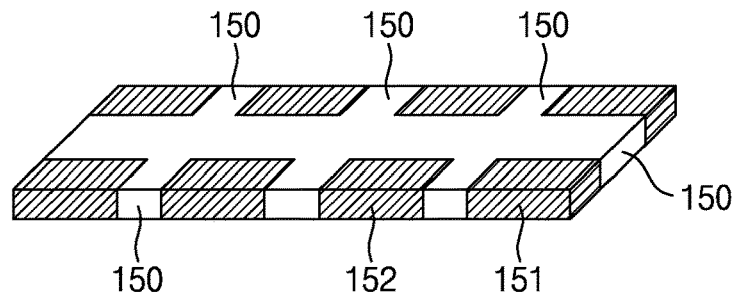

Referring to FIGS. 9, 14, and 27, an active region 123, a device isolation layer 125, a gate dielectric layer 127, gate electrodes 128, a gate capping layer 129, source/drain regions 131, an interlayer insulating layer 133, a bit contact plug 134, a bit line 135, buried contact plugs 137, a pad separation layer 150, and a plurality of conductive pads 151 and 152 may be formed on a semiconductor substrate 121. The plurality of conductive pads 151 and 152 may include a first conductive pad 151 and a second conductive pad 152.

Forming the pad separation layer 150 and the plurality of conductive pads 151 and 152 may include a thin film formation process, a patterning process, and a planarization process. The planarization process may include a chemical mechanical polishing (CMP) process, an etch-back process, or a combination thereof. Upper surfaces of the pad separation layer 150 and the plurality of conductive pads 151 and 152 may be exposed on substantially the same plane. Each of the plurality of conductive pads 151 and 152 may be surrounded by the pad separation layer 150. The plurality of conductive pads 151 and 152 may have a regular two-dimensional arrangement in a row direction and a column direction.

In an embodiment, the pad separation layer 150 may include a plurality of insulating patterns. The pad separation layer 150 may be interposed among the plurality of conductive pads 151 and 152.

Figure 28:
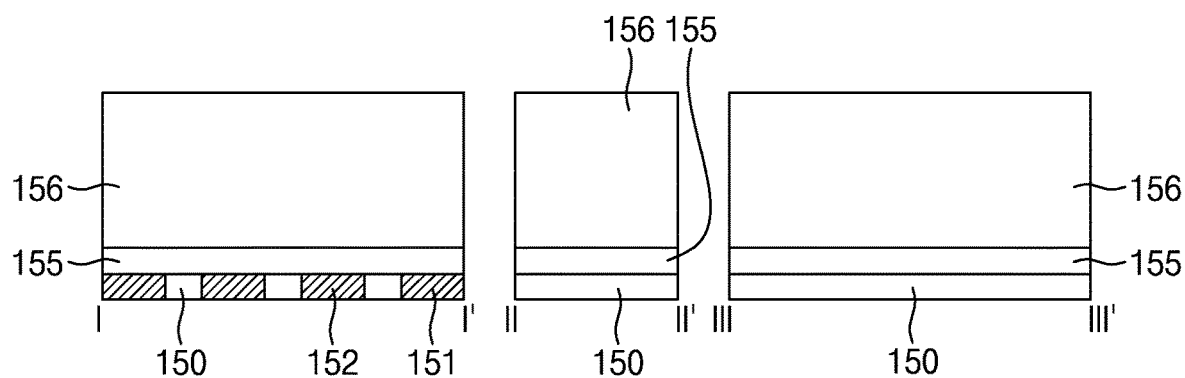
Figure 29:
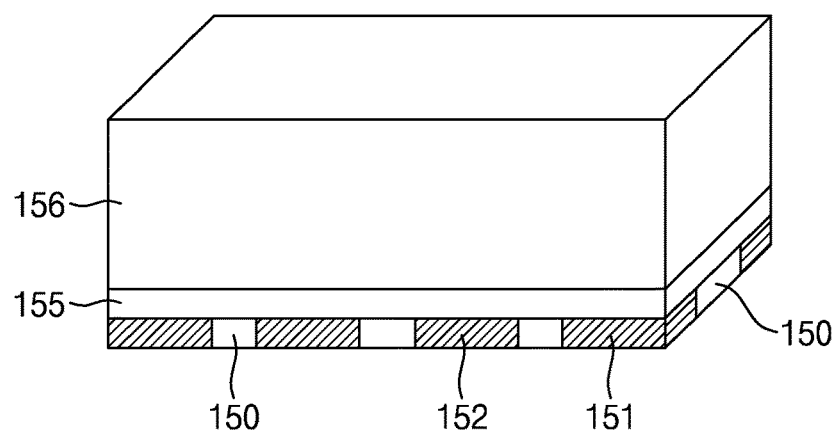

Referring to FIGS. 28 and 29, a sacrificial buffer layer 155 may be formed on the pad separation layer 150 and the plurality of conductive pads 151 and 152. A sacrificial layer 156 may be formed on the sacrificial buffer layer 155. The sacrificial buffer layer 155 may have a smaller thickness than the sacrificial layer 156.

In an embodiment, forming the sacrificial buffer layer 155 and the sacrificial layer 156 may include a substrate bonding method. The sacrificial layer 156 may include a configuration similar to that of the substrate 21 described with reference to FIGS. 1 and 2. For example, the sacrificial layer 156 may include a single-crystal perovskite strontium titanate ($SrTiO_3$) substrate. The sacrificial buffer layer 155 may be a single layer or multiple layers. The sacrificial buffer layer 155 may include a bonding layer such as silicon oxide, silicon nitride, silicon oxynitride, or a combination thereof. The sacrificial buffer layer 155 may be omitted.

In an embodiment, forming the sacrificial buffer layer 155 and the sacrificial layer 156 may include an atomic layer deposition (ALD) method, a physical vapor deposition (PVD) method, or a combination thereof. The physical vapor deposition (PVD) method may include a pulsed laser deposition (PLD) method, a molecular beam epitaxy (MBE) method, or a combination thereof.

In an embodiment, the sacrificial buffer layer 155 may include Ni, Cu, Al, Pd, or a combination thereof. The sacrificial layer 156 may include a single-crystal Ge layer, a single-crystal Si layer, a single-crystal SiC layer, a single-crystal SiGe layer, or a combination thereof. In an embodiment, forming the sacrificial layer 156 may include a process for forming a Ge layer on the sacrificial buffer layer 155, and a process for crystallizing the Ge layer through application of laser annealing. In an embodiment, the sacrificial layer 156 may be formed using an epitaxial growth method.

Figure 30:
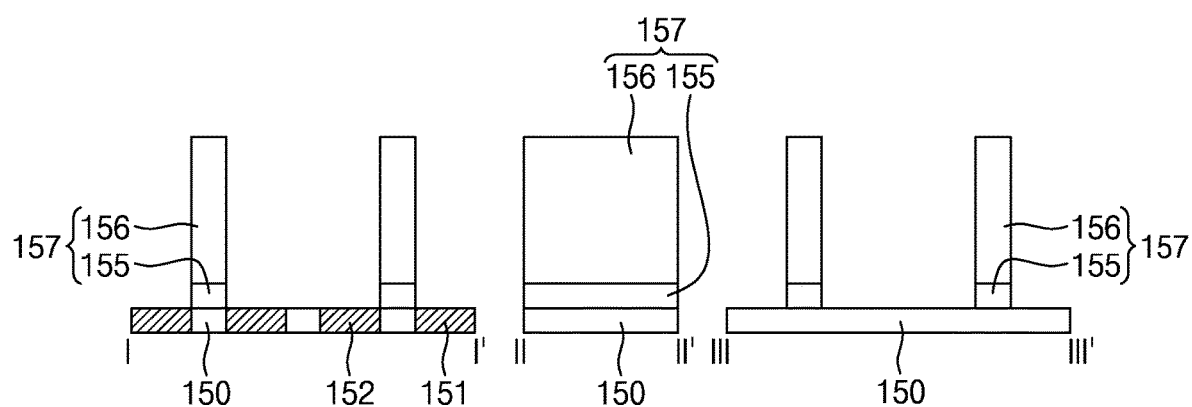
Figure 31:
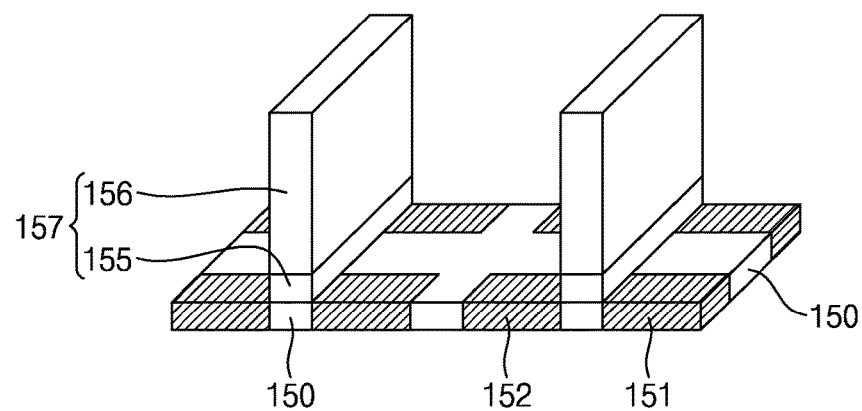

Referring to FIGS. 30 and 31, the sacrificial layer 156 and the sacrificial buffer layer 155 may be patterned, thereby forming sacrificial patterns 157. The sacrificial patterns 157 may be formed on the pad separation layer 150 among the plurality of conductive pads 151 and 152, respectively. Each of the sacrificial patterns 157 may have a greater height than a horizontal width thereof. Upper surfaces of the plurality of conductive pads 151 and 152 may be exposed. An upper surface of the pad separation layer 150 may be partially covered by the sacrificial patterns 157.

In an embodiment, the sacrificial patterns 157 may be disposed on the pad separation layer 150, to be parallel in a row direction. The sacrificial patterns 157 may be disposed among the plurality of conductive pads 151 and 152 such that each sacrificial pattern 157 alternates with every other space among the plurality of conductive pads 151 and 152.

Figure 32:
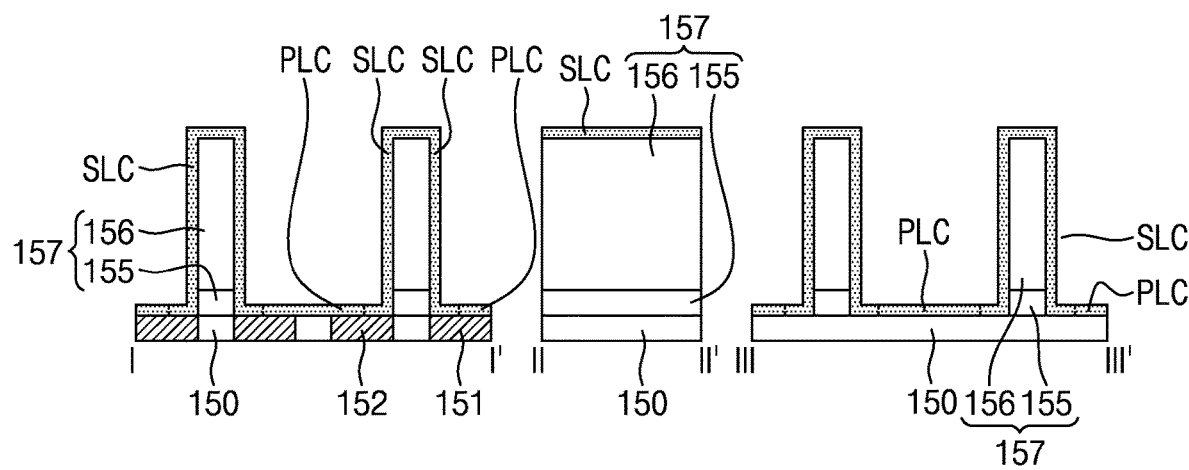
Figure 33:
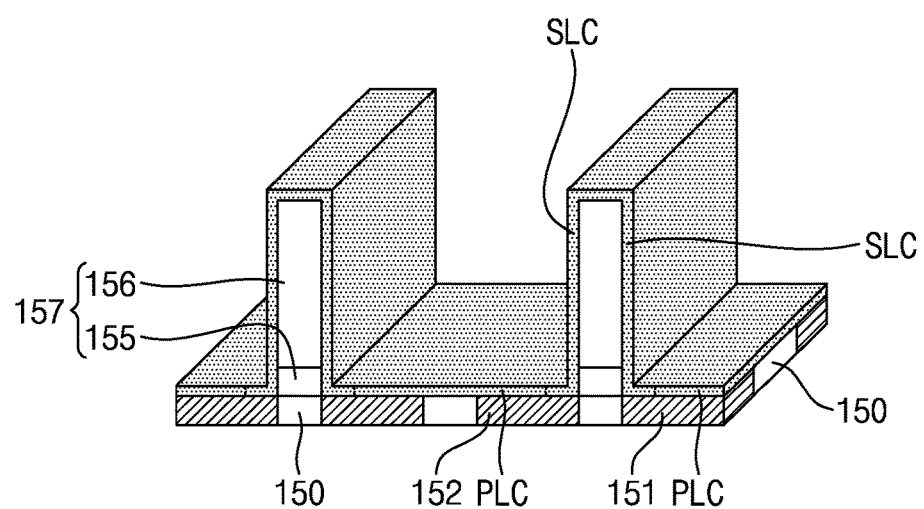

Referring to FIGS. 32 and 33, a first crystalline conductive layer SLC and a second crystalline conductive layer PLC may be formed to cover side surfaces and upper surfaces of the sacrificial patterns 157 and to cover the plurality of conductive pads 151 and 152 and the pad separation layer 150. The first crystalline conductive layer SLC may be formed to be nearer to the sacrificial patterns 157 than the second crystalline conductive layer PLC. The second crystalline conductive layer PLC may be in continuity with the first crystalline conductive layer SLC.

In an embodiment, forming the first crystalline conductive layer SLC and the second crystalline conductive layer PLC may include a method similar to that of formation of the first conductive layer 23 described with reference to FIG. 15. The first crystalline conductive layer SLC may include a single-crystal perovskite structure. The first crystalline conductive layer SLC may include a conductive material having a single-crystal perovskite structure, such as $SrRuO_3$, $SrIrO_3$, $SrSnO_3$, $SrMoO_3$, $CaRuO_3$, $LaNiO_3$, or a combination thereof. The second crystalline conductive layer PLC may include a polycrystalline perovskite structure. The second crystalline conductive layer PLC may include a conductive material having a polycrystalline perovskite structure, such as $SrRuO_3$, $SrIrO_3$, $SrSnO_3$, $SrMoO_3$, $CaRuO_3$, $LaNiO_3$, or a combination thereof. For example, the first crystalline conductive layer SLC may include a single-crystal perovskite $SrRuO_3$ layer, and the second crystalline conductive layer PLC may include a polycrystalline perovskite $SrRuO_3$ layer.

In an embodiment, forming the first crystalline conductive layer SLC and the second crystalline conductive layer PLC may include a method similar to that of formation of the first conductive layer 23 and the second conductive layer 24 described with reference to FIGS. 18 and 19. The first conductive layer 23 in the first crystalline conductive layer SLC may include a single-crystal perovskite structure, and the first conductive layer 23 in the second crystalline conductive layer PLC may include a polycrystalline perovskite structure. For example, the first conductive layer 23 in the first crystalline conductive layer SLC may include a single-crystal perovskite $SrRuO_3$ structure, and the first conductive layer 23 in the second crystalline conductive layer PLC may include a polycrystalline perovskite $SrRuO_3$ structure. The first crystalline conductive layer SLC may include the second conductive layer 24 formed on the single-crystal perovskite structure, and the second crystalline conductive layer PLC may include the second conductive layer 24 formed on the polycrystalline perovskite structure.

Figure 34:
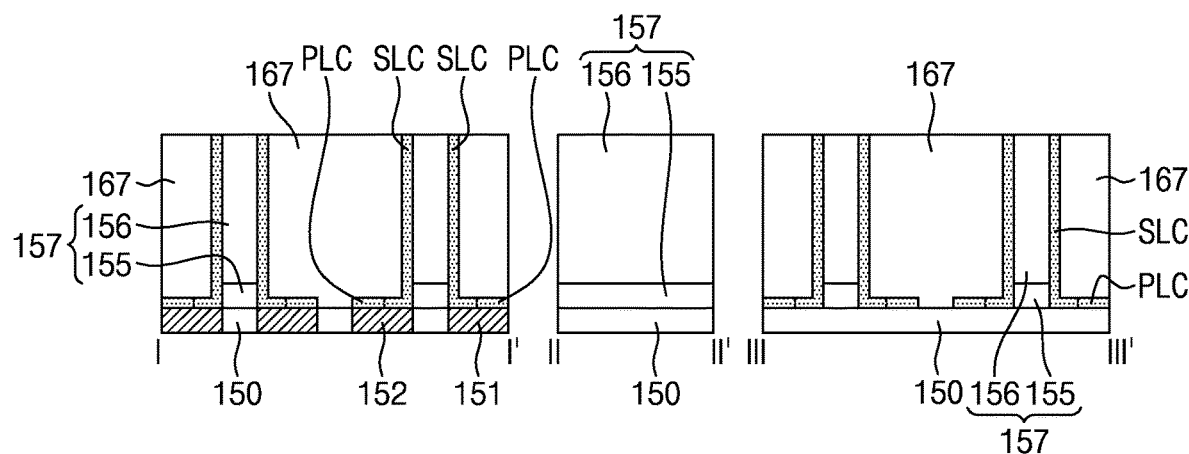
Figure 35:
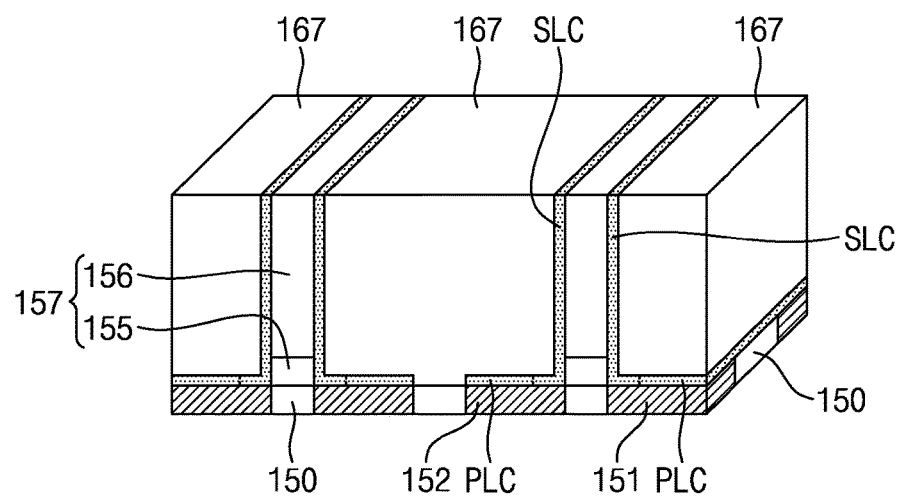

Referring to FIGS. 34 and 35, the first crystalline conductive layer SLC and the second crystalline conductive layer PLC may be partially removed, and a mold layer 167 may be formed to be buried among the sacrificial patterns 157. In formation of the mold layer 167, a thin film formation process and a planarization process may be used. The planarization process may include a chemical mechanical polishing (CMP) process, an etch-back process, or a combination thereof. Upper surfaces of the sacrificial patterns 157, an upper end of the first crystalline conductive layer SLC, and an upper surface of the mold layer 167 may be exposed. The mold layer 167 may include polysilicon.

Figure 36:
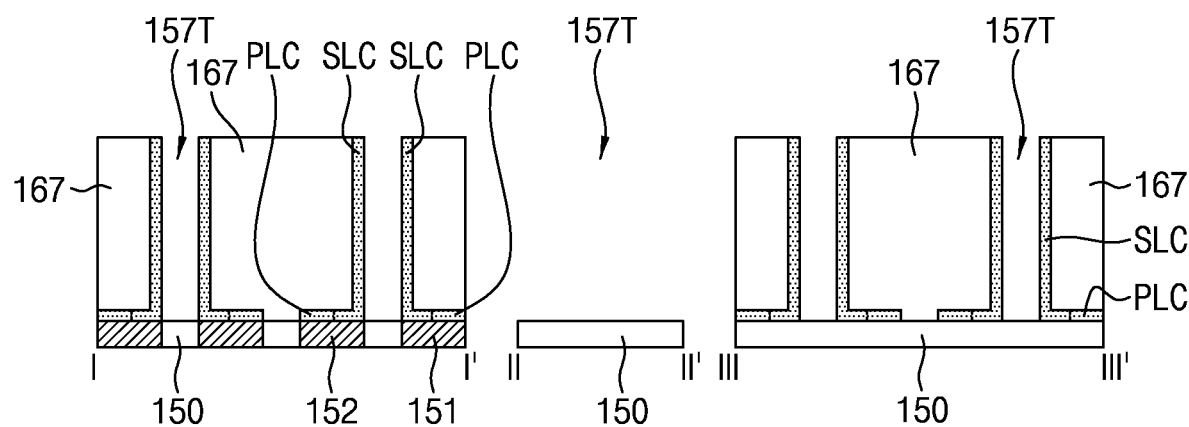
Figure 37:
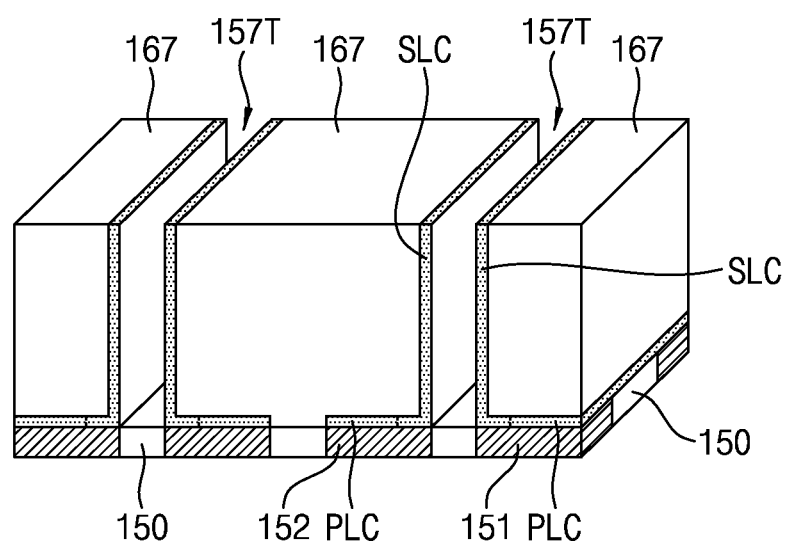

Referring to FIGS. 36 and 37, the sacrificial patterns 157 may be completely removed, thereby forming trenches 157T. The pad separation layer 150 may be exposed at a bottom of the trenches 157T. The first crystalline conductive layer SLC may be exposed at side walls of the trenches 157T.

Figure 38:
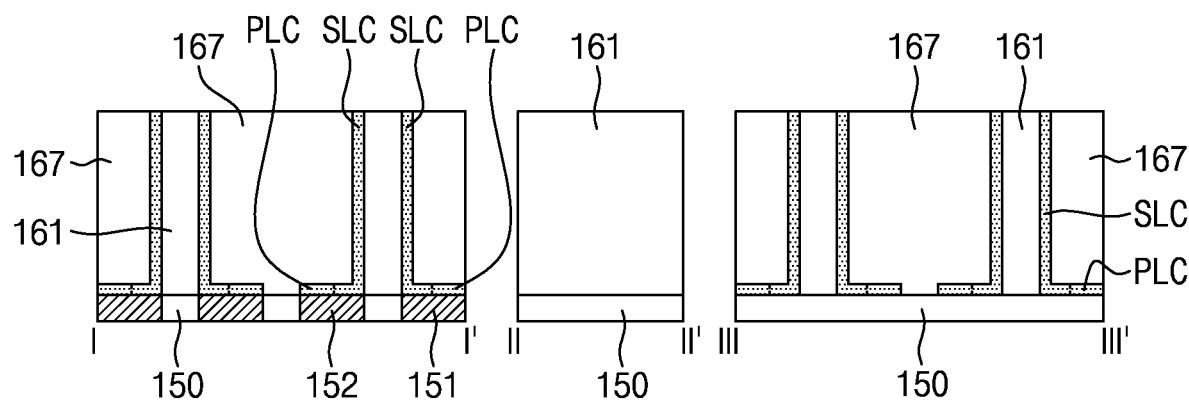
Figure 39:
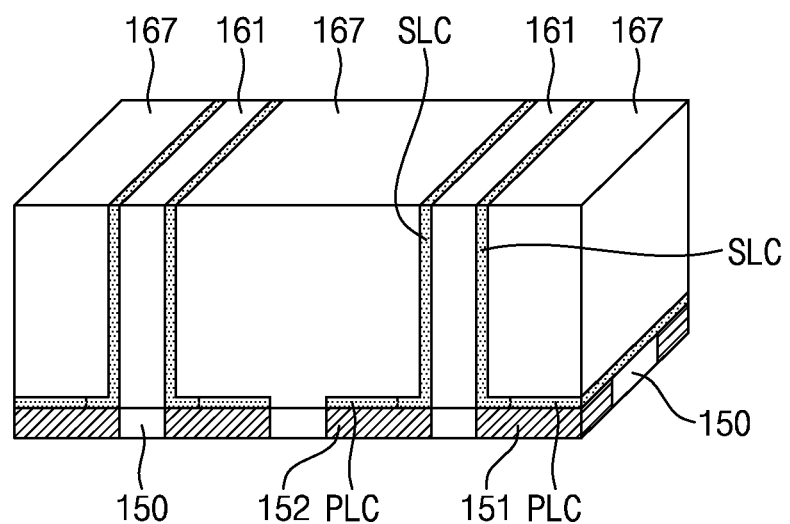

Referring to FIGS. 38 and 39, insulating patterns 161 may be formed in the trenches 157T. In formation of the insulating patterns 161, a thin film formation process and a planarization process may be used. The planarization process may include a chemical mechanical polishing (CMP) process, an etch-back process, or a combination thereof. Upper surfaces of the insulating patterns 161, the upper end of the first crystalline conductive layer SLC, and the upper surface of the mold layer 167 may be exposed. The insulating patterns 161 may include at least two selected from the group consisting of Si, O, N, C, H, and B. The insulating patterns 161 may include silicon oxide, silicon nitride, silicon oxynitride, silicon oxycarbonitride, low-k dielectrics, or a combination thereof. In an embodiment, the insulating patterns 161 may include silicon oxide.

The insulating patterns 161 may each have a single-layer structure. The insulating patterns 161 may each have a materially-contiguous integral structure. The insulating patterns 161 may each directly contact the pad separation layer 150.

Figure 40:
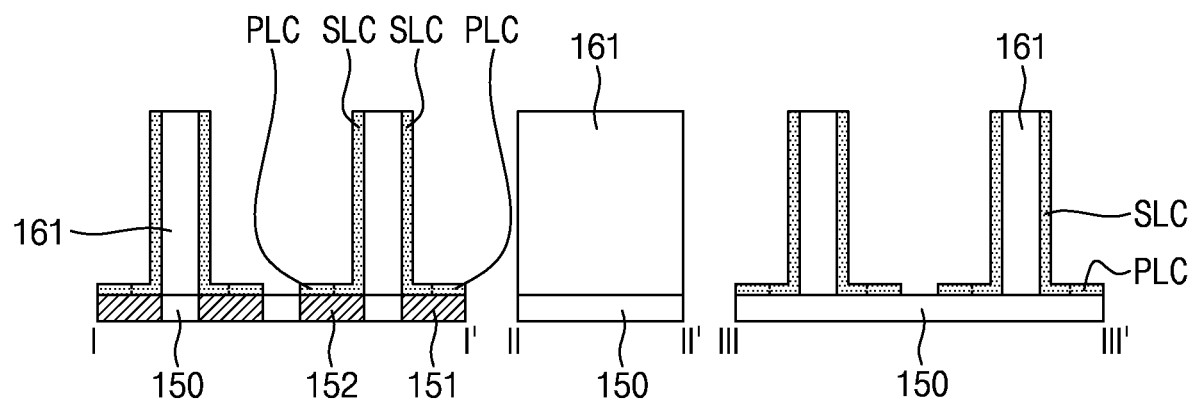
Figure 41:
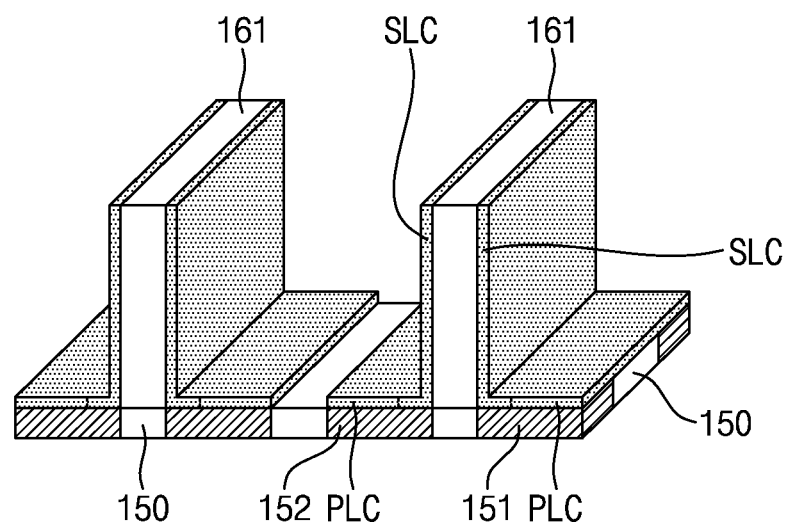

Referring to FIGS. 40 and 41, the mold layer 167 may be completely removed, thereby exposing the first crystalline conductive layer SLC and the second crystalline conductive layer PLC.

Figure 42:
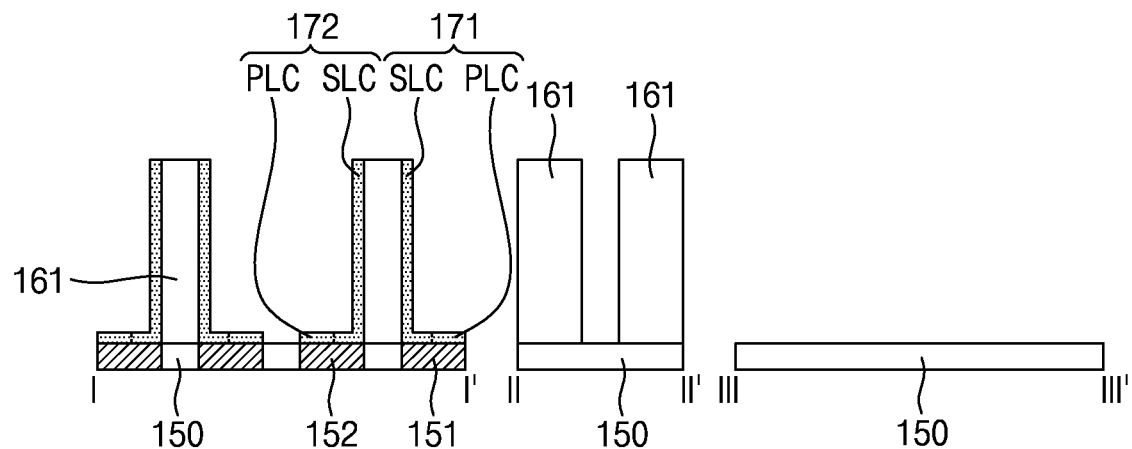
Figure 43:
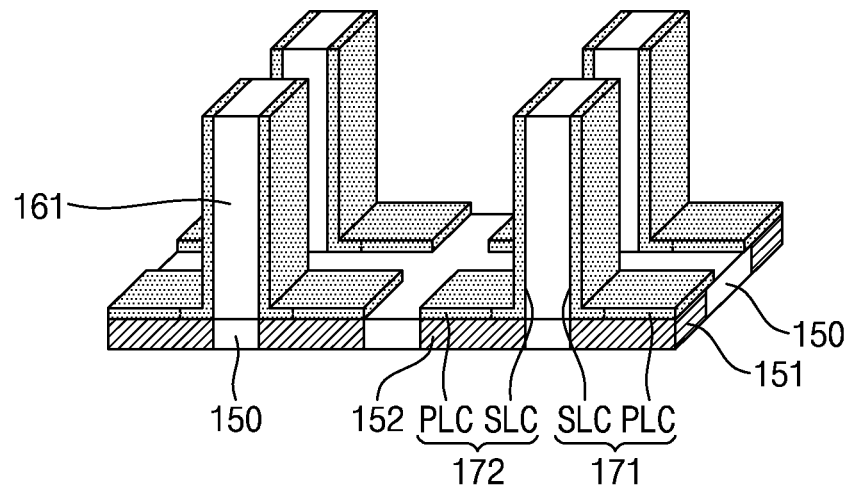

Referring to FIGS. 42 and 43, a plurality of first electrodes 171 and 172 may be formed using a node separation process. The plurality of first electrodes 171 and 172 may include a right electrode 171 and a left electrode 172. The insulating patterns 161 may be preserved among the plurality of first electrodes 171 and 172, respectively. Each of the plurality of first electrodes 171 and 172 may include the first crystalline conductive layer SLC, and the second crystalline conductive layer PLC in continuity with the first crystalline conductive layer SLC.

Figure 44:
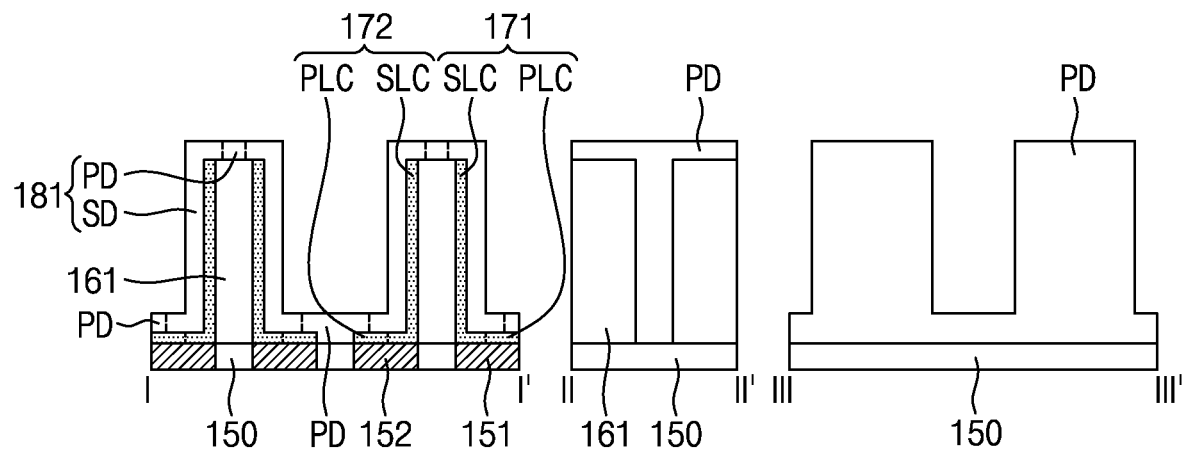
Figure 45:
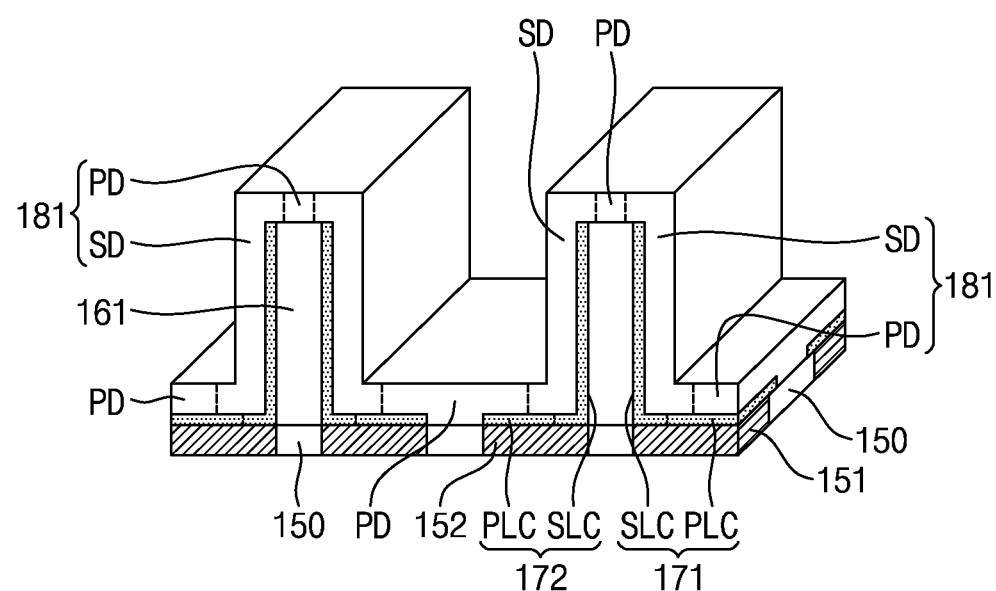

Referring to FIGS. 44 and 45, a dielectric layer 181 may be formed to cover the plurality of first electrodes 171 and 172, the insulating pattens 161, and the pad separation layer 150 in plan view. The dielectric layer 181 may include a first dielectric region SD and a second dielectric region PD. The first dielectric region SD may be formed to be nearer to the first crystalline conductive layer SLC than the second dielectric region PD. The second dielectric region PD may be in continuity with the first dielectric region SD. Forming the dielectric layer 181 may include a method similar to that of formation of the first dielectric layer 26 and the second dielectric layer 27 described with reference to FIGS. 16 and 17. The first dielectric region SD may be aligned to overlap with the first crystalline conductive layer SLC. The first dielectric region SD may have a greater width than the first crystalline conductive layer SLC.

The first dielectric region SD may include a configuration similar to those of the first dielectric layer 26 and the second dielectric layer 27 described with reference to FIGS. 16 and 17. The first dielectric layer 26 in the first dielectric region SD may include a single-crystal perovskite structure. The first dielectric layer 26 in the first dielectric region SD may include a dielectric material having a single-crystal perovskite structure, such as $SrTiO_3$, $BaTiO_3$, $SrBaTiO_3$, $CaTiO_3$, $SrZrO_3$, $SrHfO_3$, $LaAlO_3$, or a combination thereof. The first dielectric region SD may include the second dielectric layer 27 on the first dielectric layer 26.

The first dielectric layer 26 in the second dielectric region PD may include a polycrystalline perovskite structure. The first dielectric layer 26 in the second dielectric region PD may include a dielectric material having a polycrystalline perovskite structure, such as $SrTiO_3$, $BaTiO_3$, $SrBaTiO_3$, $CaTiO_3$, $SrZrO_3$, $SrHfO_3$, $LaAlO_3$, or a combination thereof. The second dielectric region PD may include the second dielectric layer 27 on the first dielectric layer 26.

Figure 46:
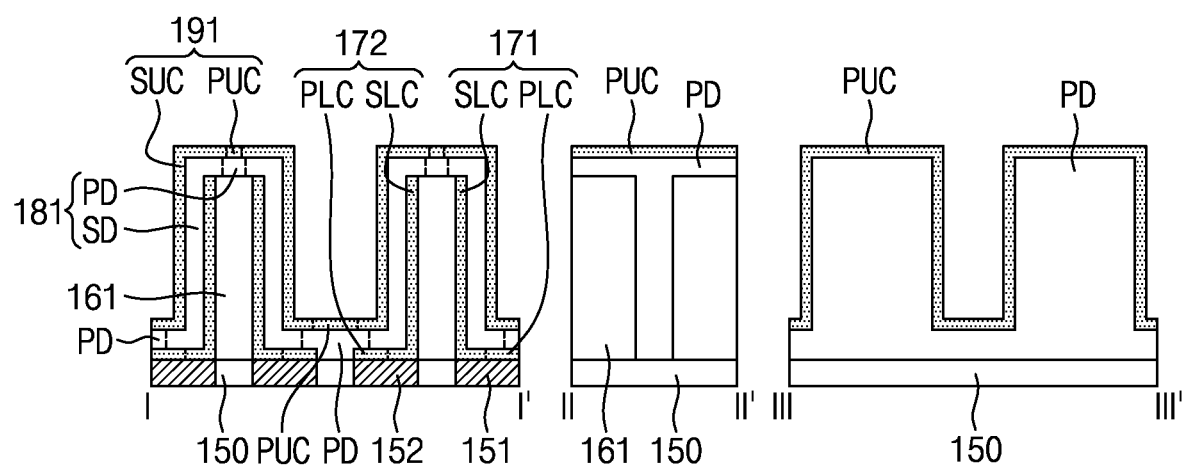

Referring to FIGS. 12 and 46, a second electrode 191 may be formed on the dielectric layer 181. The second electrode 191 may include a first region SUC and a second region PUC. The first region SUC may be formed to be nearer to the first dielectric region SD than the second region PUC. The second region PUC may be in continuity with the first region SUC. Forming the second electrode 191 may include a method similar to that of formation of the second electrode 29 described with reference to FIG. 2. The first region SUC may be aligned to overlap with the first dielectric region SD. The first region SUC may have a greater width than the first dielectric region SD.

In an embodiment, the first region SUC may include a single-crystal perovskite structure. The second region PUC may include a polycrystalline structure.

Again referring to FIGS. 9 to 14, the additional electrode 196 may be formed on the second electrode 191. The additional electrode 196 may include a conductive material such as a metal, metal nitride, metal oxide, metal silicide, polysilicon, conductive carbon, or a combination thereof. The upper insulating layer 197 may be formed on the additional electrode 196. The upper insulating layer 197 may include at least two selected from the group consisting of Si, O, N, C, H, and B. The upper contact plug 198 may be formed to contact the additional electrode 196 while extending through the upper insulating layer 197. The upper wiring 199 may be formed on the upper insulating layer 197, to contact the upper contact plug 198. The upper contact plug 198 and the upper wiring 199 may include a conductive material such as a metal, metal nitride, metal oxide, metal silicide, polysilicon, conductive carbon, or a combination thereof.

In accordance with the exemplary embodiments of the disclosure, a first electrode, a first dielectric layer, a second dielectric layer and a second electrode on a single-crystal structure may be provided. The first dielectric layer and the second dielectric layer may constitute a dielectric layer. Each of the first electrode and the first dielectric layer may include a single-crystal perovskite structure. The dielectric constant of the dielectric layer may remarkably increase. Semiconductor devices having excellent electrical characteristics and methods of forming the same may be provided.

While the embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:

1. A method of forming a semiconductor device, comprising:
   forming a first electrode on a single-crystal structure;
   forming a dielectric layer on the first electrode; and
   forming a second electrode on the dielectric layer,
   wherein the forming a dielectric layer comprises:
   forming a first dielectric layer having a single-crystal perovskite structure on the first electrode; and
   forming a second dielectric layer on the first dielectric layer,
   wherein an upper surface of the first dielectric layer adjacent to the second dielectric layer has a greater surface roughness than an upper surface of the second dielectric layer adjacent to the second electrode, and
   wherein the first dielectric layer comprises $SrTiO_3$, $SrBaTiO_3$, $CaTiO_3$, $SrZrO_3$, $SrHfO_3$, $LaAlO_3$, or a combination thereof.

2. The method according to claim 1, wherein forming the first dielectric layer comprises an atomic layer deposition (ALD) method, a physical vapor deposition (PVD) method, or a combination thereof.

3. The method according to claim 1, wherein the first dielectric layer has a thickness of 2 to 30 nm.

4. The method according to claim 1, wherein a thickness of the second dielectric layer is 0.05 to 0.3 times a thickness of the first dielectric layer.

5. The method according to claim 1, wherein the second dielectric layer comprises SrO, BaO, $TiO_2$, $ZrO_2$, $HfO_2$, $Al_2O_3$, LaO, or a combination thereof.

6. The method according to claim 1, wherein the forming a first electrode comprises forming a first conductive layer having a single-crystal perovskite structure on the single-crystal structure.

7. The method according to claim 6, wherein the first conductive layer comprises $SrRuO_3$, $SrIrO_3$, $SrSnO_3$, $SrMoO_3$, $CaRuO_3$, $LaNiO_3$, or a combination thereof.

8. The method according to claim 6, wherein forming the first conductive layer comprises a pulsed laser deposition (PLD) method, a molecular beam epitaxy (MBE) method, or an atomic layer deposition (ALD) method.

9. The method according to claim 6, further comprising:
forming a second conductive layer on the first conductive layer,
wherein an upper surface of the second conductive layer adjacent to the dielectric layer has a smaller surface roughness than an upper surface of the first conductive layer adjacent to the second conductive layer.

10. The method according to claim 1, wherein the single-crystal structure comprises a single-crystal perovskite strontium titanate ($SrTiO_3$).

11. The method according to claim 1, wherein the dielectric layer has a dielectric constant of 100 to 900.

12. The method according to claim 1, wherein the second electrode comprises Ru, $RuO_2$, Ir, $IrO_2$, $SrRuO_3$, $SrIrO_3$, $SrSnO_3$, $SrMoO_3$, $CaRuO_3$, $LaNiO_3$, or a combination thereof.

13. A method of forming a semiconductor device, comprising:
forming a switching device on a semiconductor substrate;
forming a pad separation layer on the switching device;
forming a conductive pad connected to the switching device while extending through the pad separation layer;
forming a first electrode on the conductive pad;
forming a dielectric layer on the first electrode; and
forming a second electrode on the dielectric layer,
wherein the forming a dielectric layer comprises:
forming a first dielectric layer having a single-crystal perovskite structure on the first electrode; and
forming a second dielectric layer on the first dielectric layer,
wherein an upper surface of the first dielectric layer adjacent to the second dielectric layer has a greater surface roughness than an upper surface of the second dielectric layer adjacent to the second electrode, and
wherein the first dielectric layer comprises $SrTiO_3$, $SrBaTiO_3$, $CaTiO_3$, $SrZrO_3$, $SrHfO_3$, $LaAlO_3$, or a combination thereof.

14. The method according to claim 13, further comprising:
forming an insulating pattern on the pad separation layer, the insulating pattern having a greater height than a horizontal width thereof,
wherein the first electrode contacts a side surface of the insulating pattern.

15. The method according to claim 14, wherein forming the insulating pattern comprises:
forming a sacrificial pattern on the pad separation layer;
forming the first electrode on the sacrificial pattern, and then removing the sacrificial pattern, thereby forming a trench; and
forming the insulating pattern in the trench.

16. The method according to claim 15, wherein the sacrificial pattern comprises a single-crystal perovskite structure.

17. The method according to claim 15, wherein the sacrificial pattern comprises a single-crystal perovskite strontium titanate ($SrTiO_3$).

18. The method according to claim 13, wherein:
forming the first dielectric layer comprises an atomic layer deposition (ALD) method, a physical vapor deposition (PVD) method, or a combination thereof.

19. A method of forming a semiconductor device, comprising:
forming a first electrode having a single-crystal perovskite structure on a single-crystal perovskite strontium titanate ($SrTiO_3$) substrate using a pulsed laser deposition (PLD) method;
forming a dielectric layer on the first electrode; and
forming a second electrode on the dielectric layer,
wherein the forming a dielectric layer comprises:
forming a first dielectric layer having a single-crystal perovskite structure on the first electrode using an atomic layer deposition (ALD) method; and
forming a second dielectric layer on the first dielectric layer,
wherein an upper surface of the first dielectric layer adjacent to the second dielectric layer has a greater surface roughness than an upper surface of the second dielectric layer adjacent to the second electrode,
wherein a thickness of the second dielectric layer is 0.05 to 0.3 times a thickness of the first dielectric layer, and
wherein the dielectric layer has a dielectric constant of 100 to 900.

* * * * *